(12) United States Patent
Kim et al.

(10) Patent No.: US 9,368,646 B2
(45) Date of Patent: Jun. 14, 2016

(54) MEMORY DEVICES AND METHODS OF MANUFACTURING THE SAME

(71) Applicants: Jin-Gyun Kim, Suwon-si (KR); Jae-Young Ahn, Seongnam-si (KR); Ki-Hyun Hwang, Seongnam-si (KR)

(72) Inventors: Jin-Gyun Kim, Suwon-si (KR); Jae-Young Ahn, Seongnam-si (KR); Ki-Hyun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/182,325

(22) Filed: Feb. 18, 2014

(65) Prior Publication Data
US 2014/0239375 A1  Aug. 28, 2014

(30) Foreign Application Priority Data
Feb. 25, 2013  (KR) ........................ 10-2013-0019786

(51) Int. Cl.
*H01L 27/115* (2006.01)
*H01L 29/792* (2006.01)
*H01L 29/66* (2006.01)

(52) U.S. Cl.
CPC ...... *H01L 29/7926* (2013.01); *H01L 27/11582* (2013.01); *H01L 29/66833* (2013.01)

(58) Field of Classification Search
CPC ................... H01L 29/7926; H01L 29/66833; H01L 27/11582; H01L 27/11556; H01L 27/11578; H01L 27/115; H01L 29/792
See application file for complete search history.

(56) References Cited

U.S. PATENT DOCUMENTS

| | | |
|---|---|---|
| 7,148,538 B2 | 12/2006 | Forbes |
| 7,339,239 B2 | 3/2008 | Forbes |
| 7,394,696 B2 | 7/2008 | Lee et al. |
| 8,456,909 B2 | 6/2013 | Lee et al. |
| 2010/0133606 A1 | 6/2010 | Jang et al. |
| 2010/0252909 A1 | 10/2010 | Nakanishi et al. |
| 2011/0233648 A1 | 9/2011 | Seol et al. |
| 2012/0003800 A1 | 1/2012 | Lee et al. |
| 2012/0052674 A1 | 3/2012 | Lee et al. |
| 2012/0083077 A1* | 4/2012 | Yang ................ H01L 27/11582 438/156 |
| 2012/0098050 A1* | 4/2012 | Shim et al. .................... 257/324 |

FOREIGN PATENT DOCUMENTS

| | | |
|---|---|---|
| KR | 1020080032693 A | 4/2008 |
| KR | 1020100053851 A | 5/2010 |
| KR | 0297109 | 5/2011 |
| KR | 101113766 B1 | 2/2012 |

* cited by examiner

*Primary Examiner* — Whitney T Moore
(74) *Attorney, Agent, or Firm* — Myers Bigel & Sibley, P.A.

(57) ABSTRACT

A vertical memory device includes a channel array, a charge storage layer structure, multiple gate electrodes and a dummy pattern array. The channel array includes multiple channels, each of which is formed on a first region of a substrate and is formed to extend in a first direction substantially perpendicular to a top surface of the substrate. The charge storage layer structure includes a tunnel insulation layer pattern, a charge storage layer pattern and a blocking layer pattern, which are sequentially formed on a sidewall of each channel in the second direction substantially parallel to the top surface of the substrate. The gate electrodes arranged on a sidewall of the charge storage layer structure and spaced apart from each other in the first direction. The dummy pattern array includes multiple dummy patterns, each of which is formed on a second region adjacent the first region of the substrate and is formed to extend in the first direction.

20 Claims, 25 Drawing Sheets

FIRST DIRECTION
SECOND DIRECTION
THIRD DIRECTION

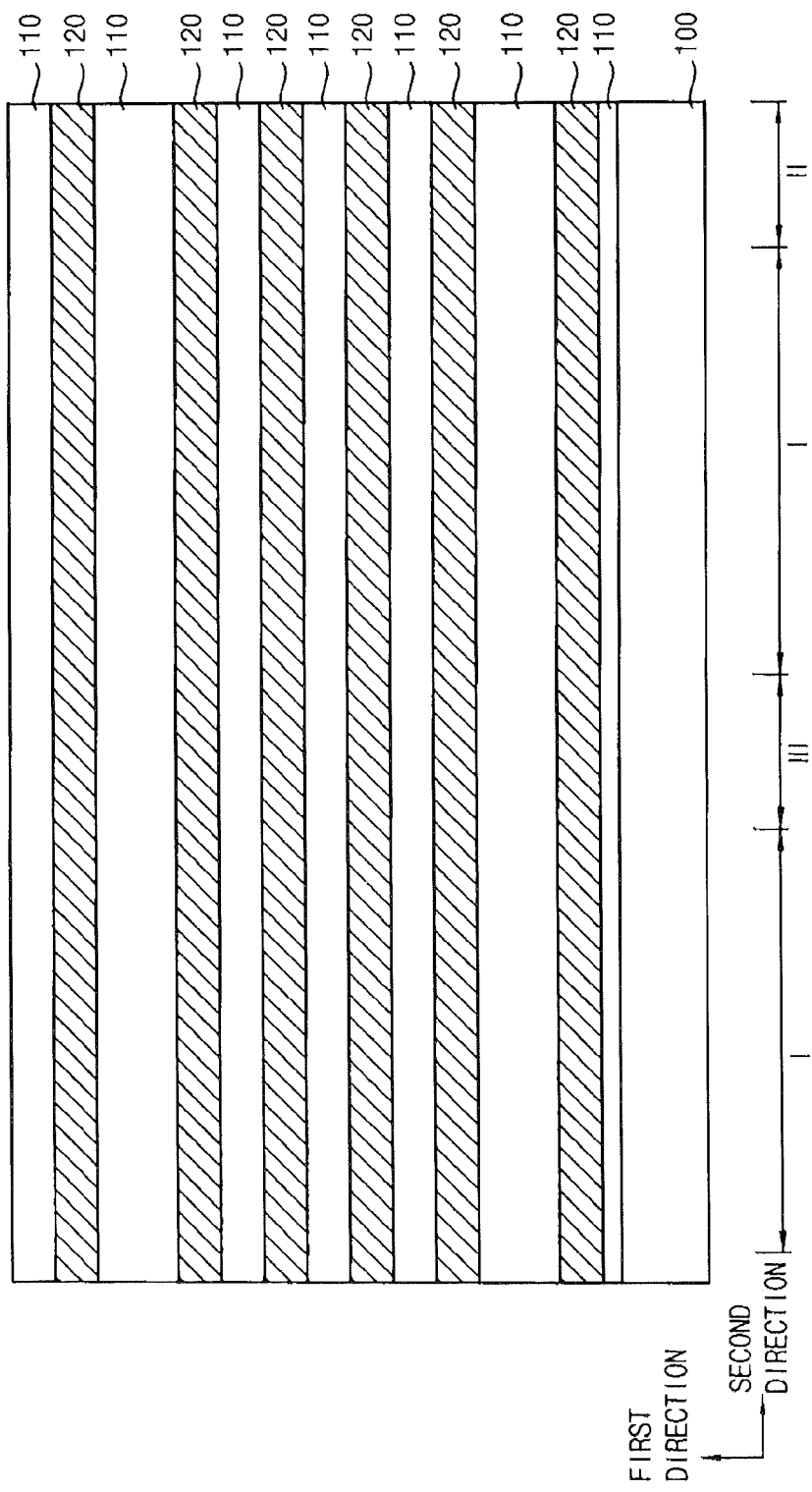

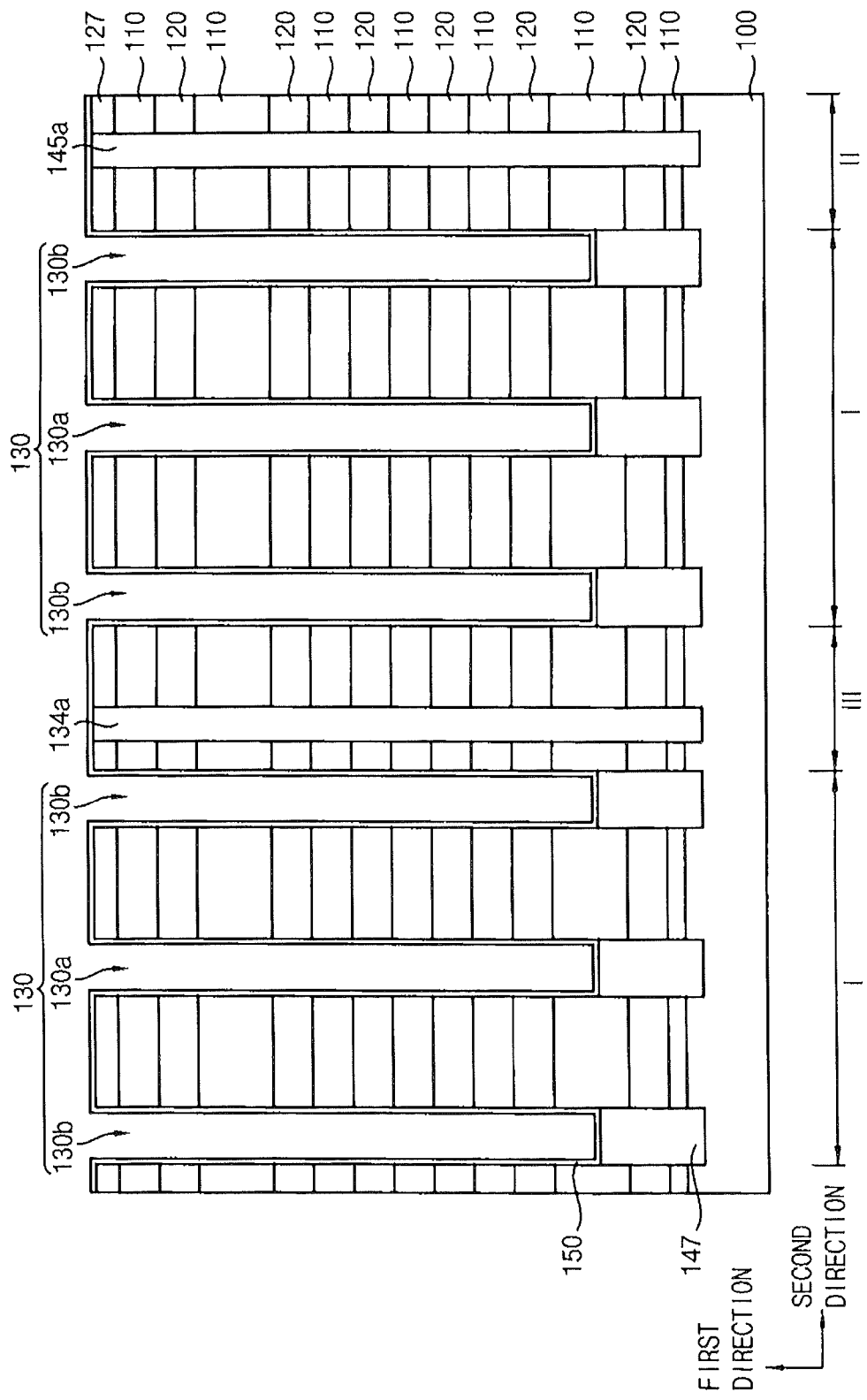

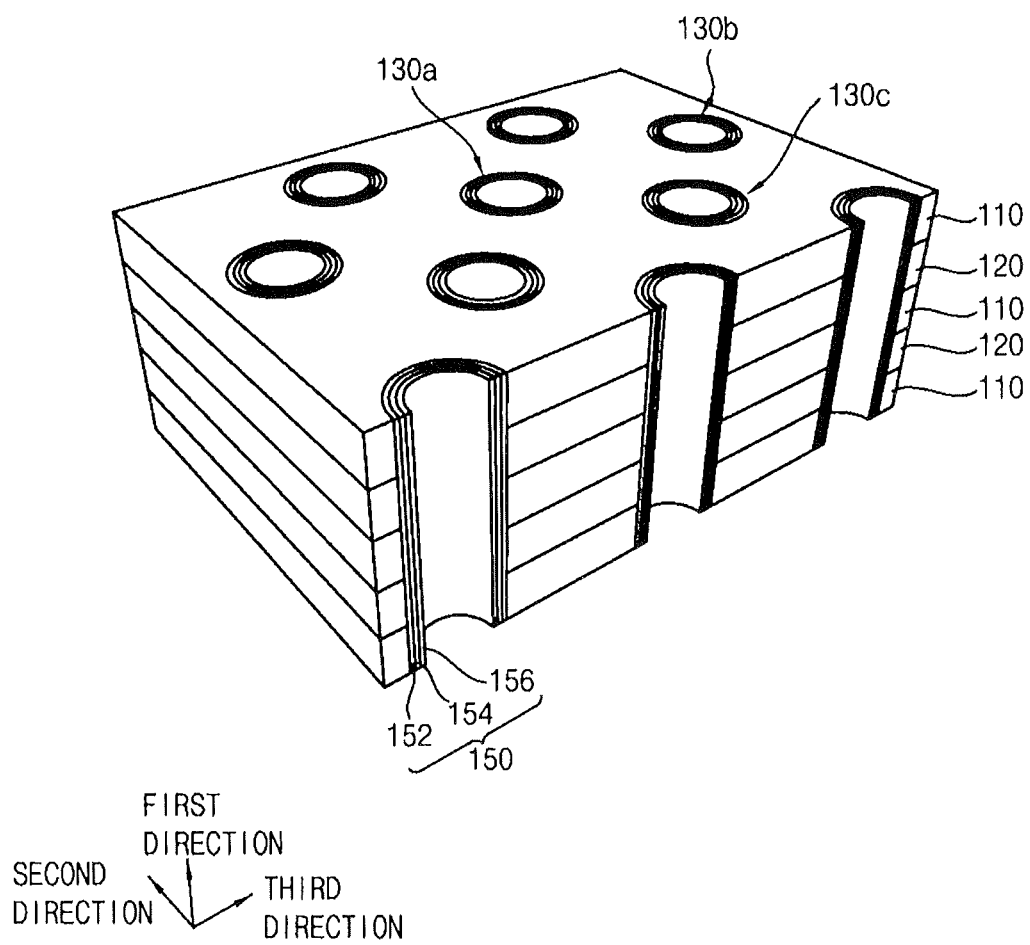

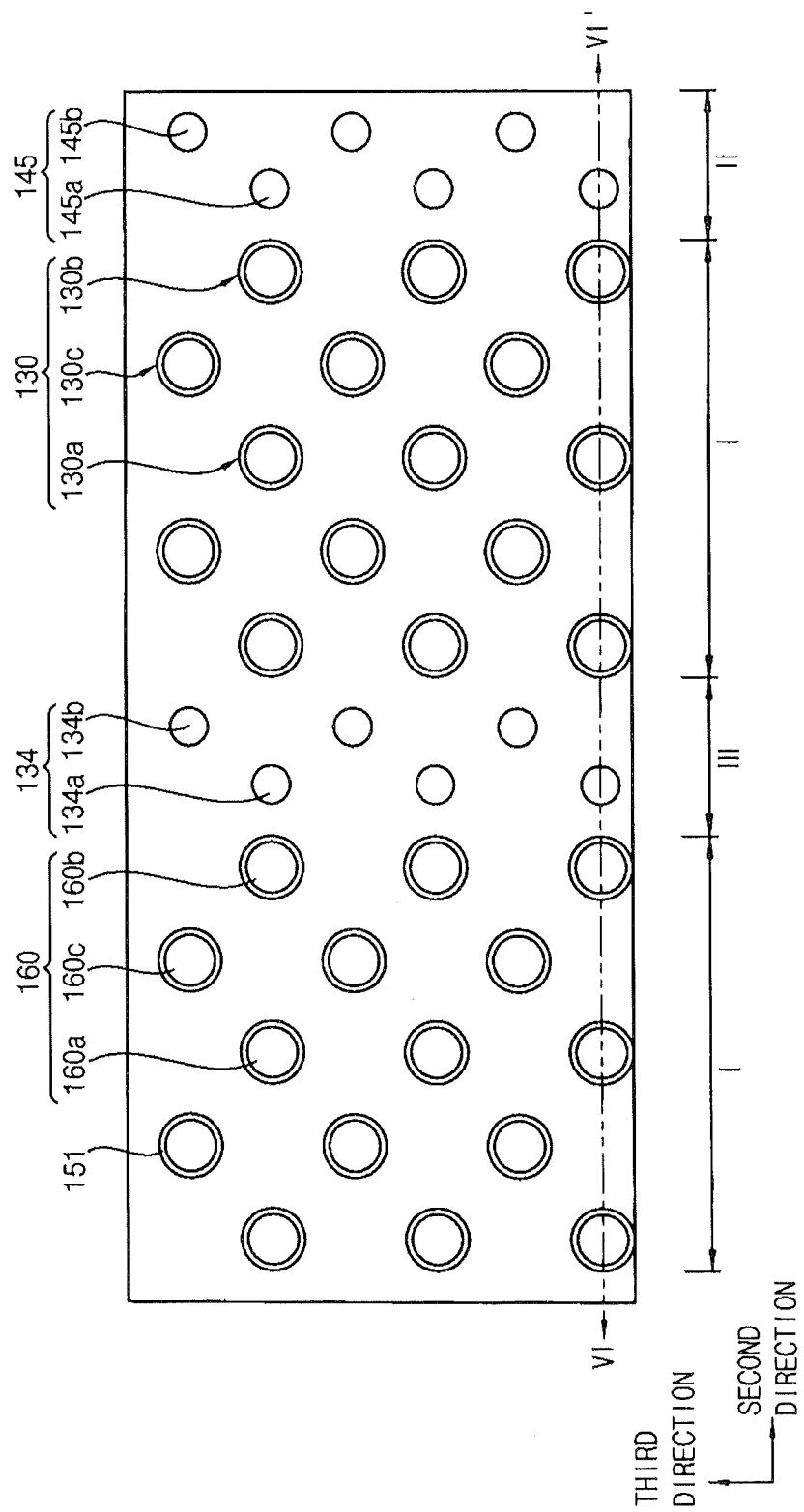

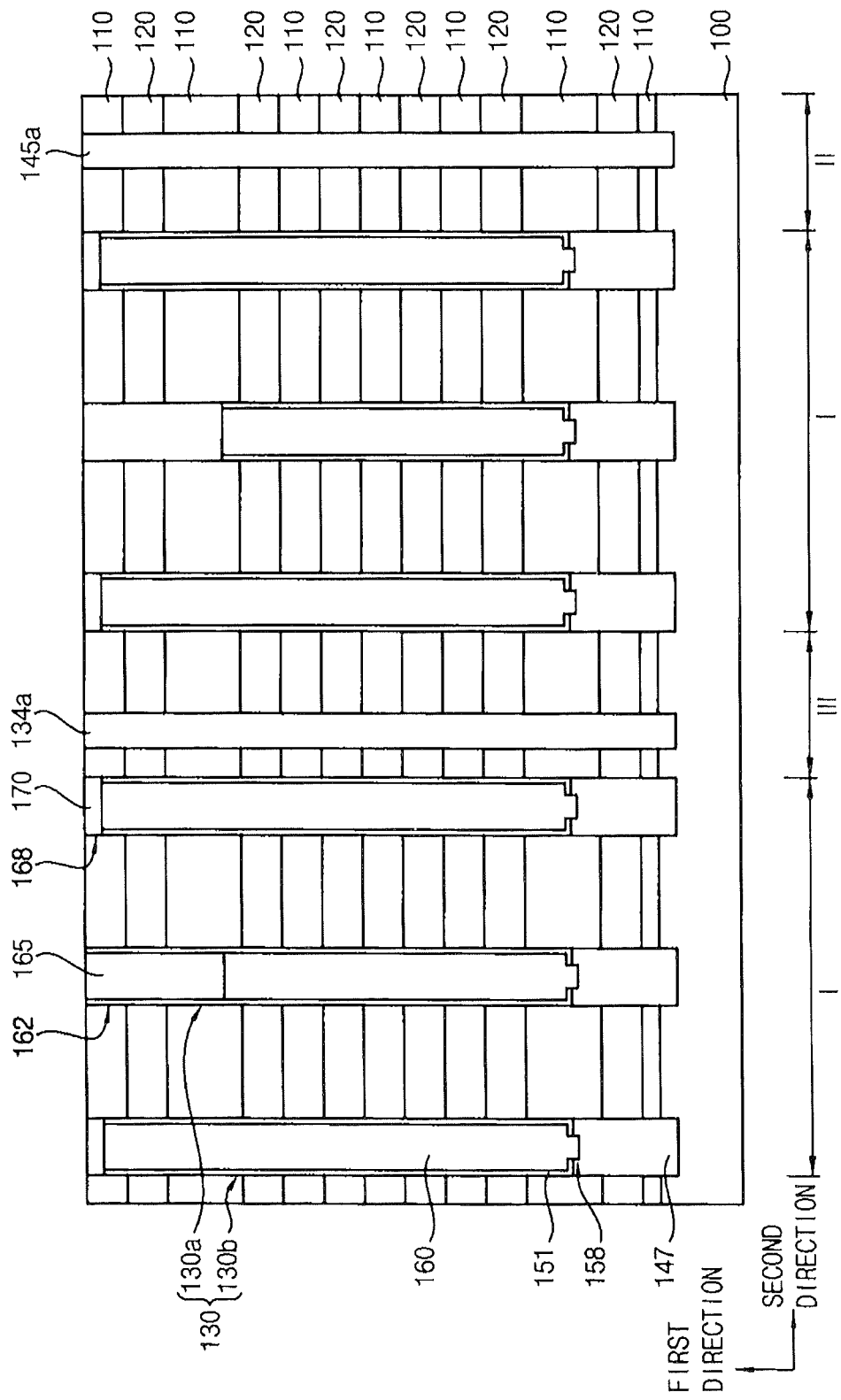

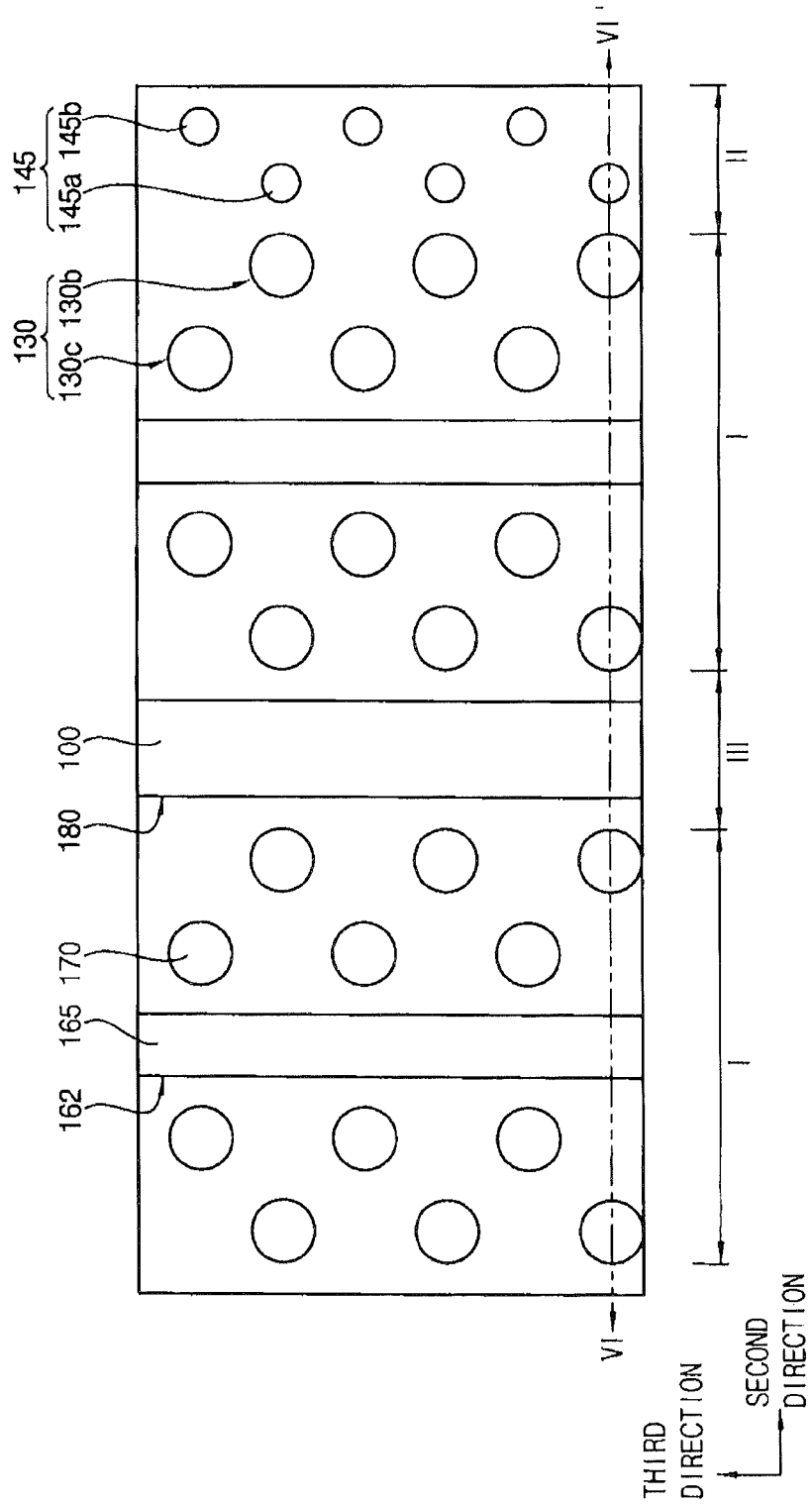

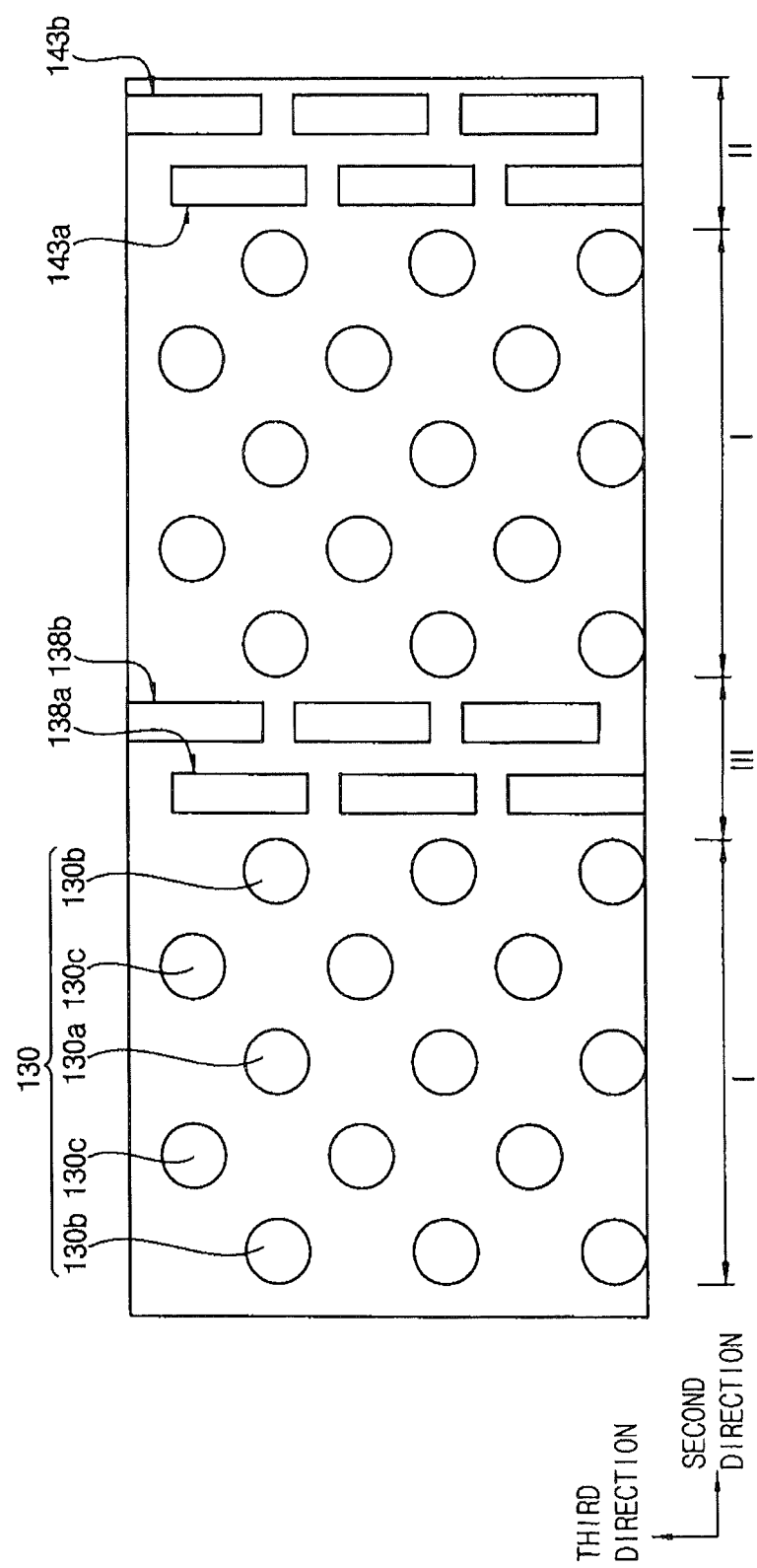

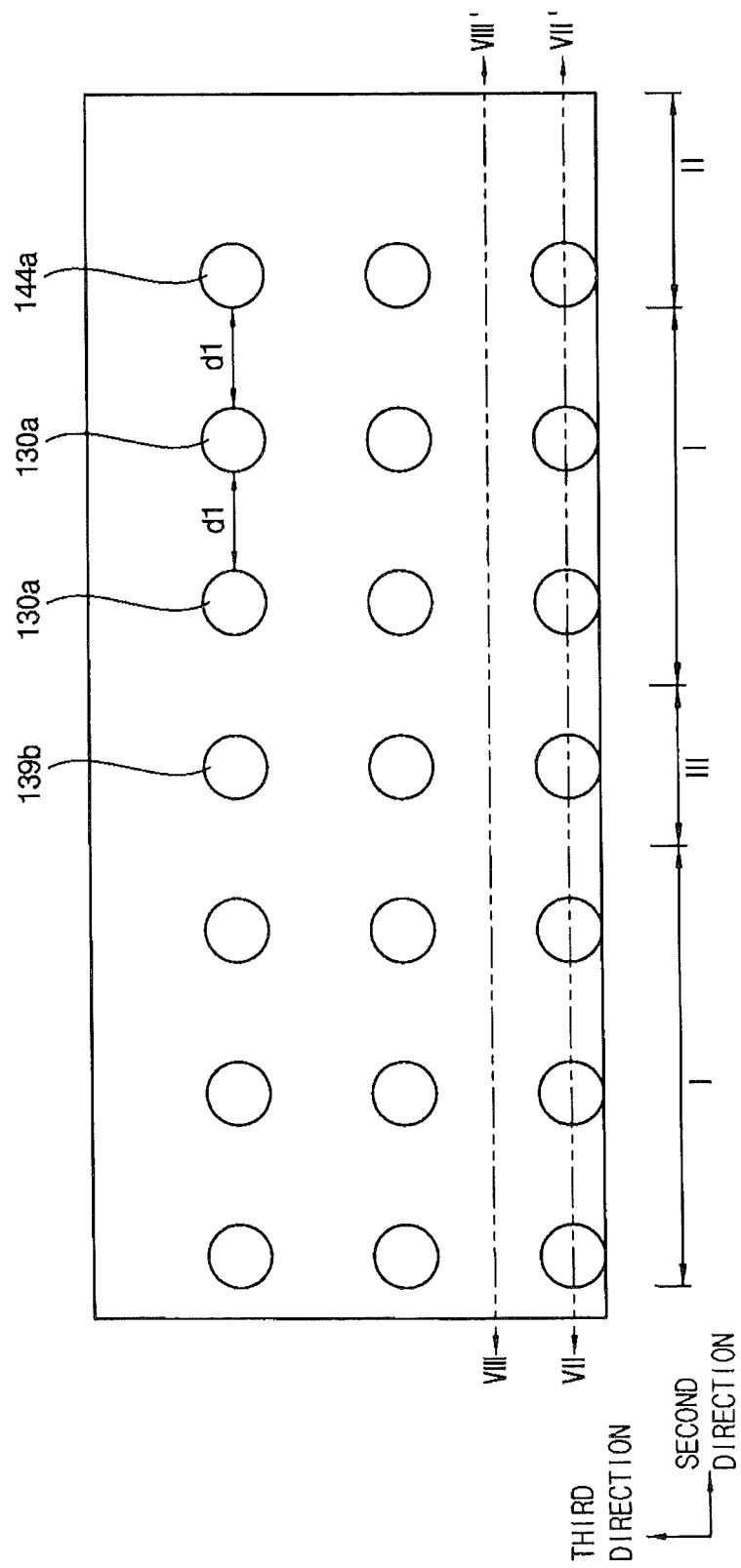

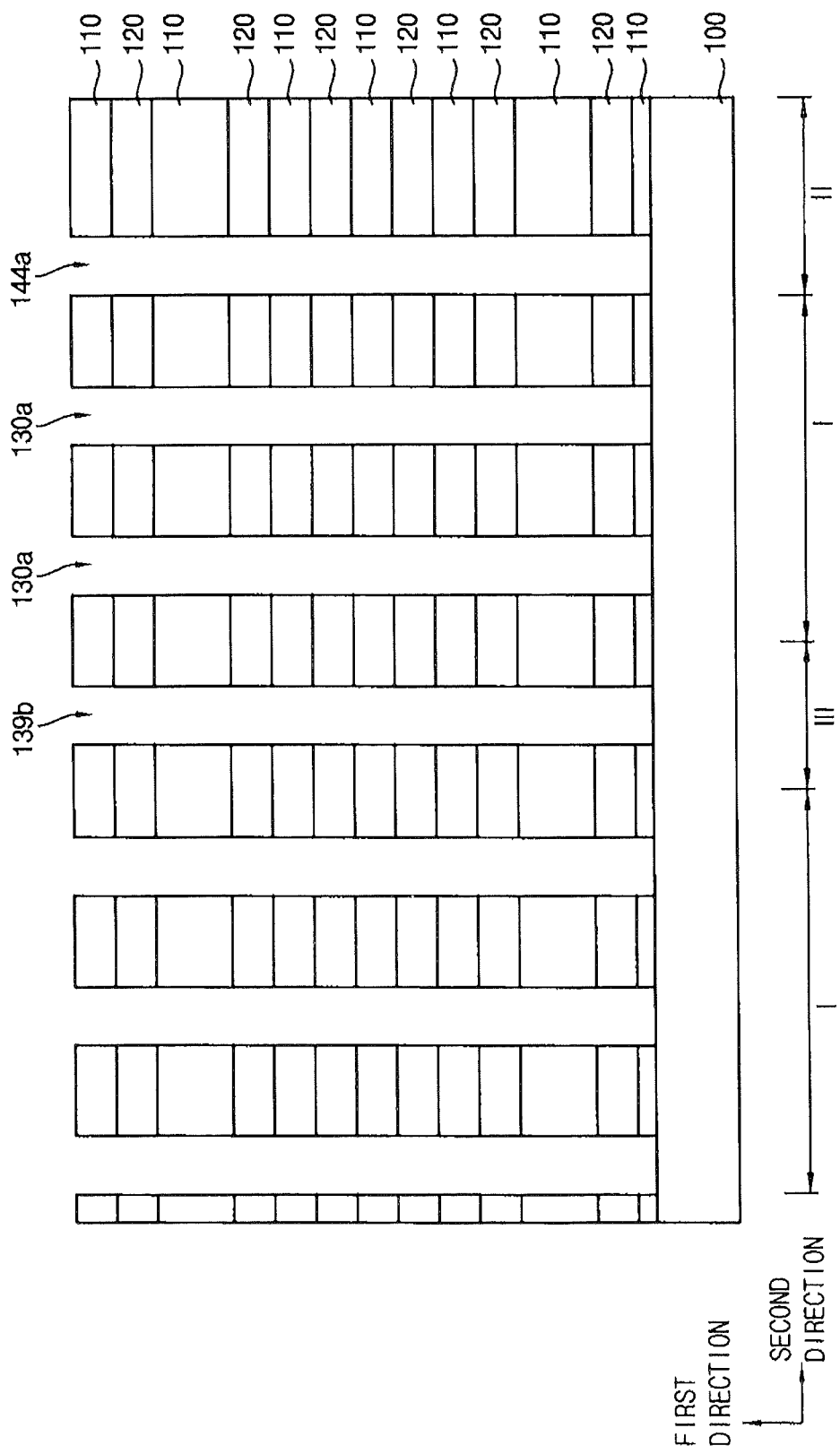

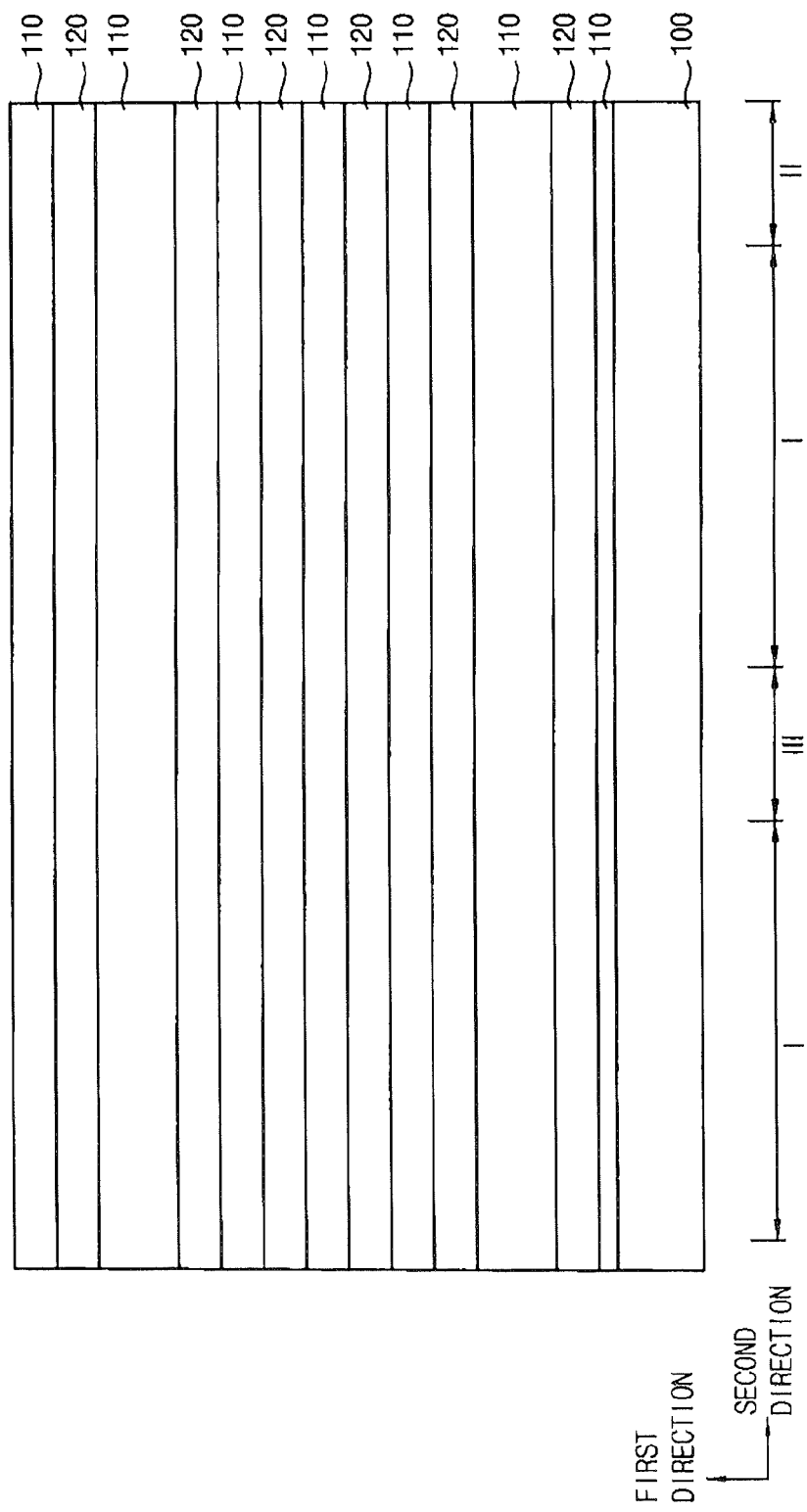

MEMORY DEVICES AND METHODS OF MANUFACTURING THE SAME

CROSS-REFERENCE TO RELATED APPLICATION

This application claims priority under 35 USC §119 to Korean Patent Application No. 10-2013-0019786, filed on Feb. 25, 2013 in the Korean Intellectual Property Office (KIPO), the contents of which are herein incorporated by reference in their entirety.

BACKGROUND

In methods of manufacturing vertical memory devices, an insulation layer and a sacrificial layer may be alternately and repeatedly formed on a substrate. Holes may be formed through the insulation layers and the sacrificial layers. Channels may be formed to fill the holes. Openings may be formed through the insulation layers and the sacrificial layers. The sacrificial layers exposed by the openings may be removed to form gaps exposing the channels. ONO layers and gate structures including gate electrodes may be formed to fill the gaps.

The holes may have a high aspect ratio and may be arranged at a small distance, relatively. Problems of forming the holes unevenly or deforming the formed holes may occur.

SUMMARY

Some embodiments provide vertical memory devices having a good reliability.

Some embodiments provide methods of manufacturing the vertical memory device having a good reliability.

According to some embodiments, there is provided a vertical memory device. The vertical memory device includes a channel array, a charge storage layer structure, multiple gate electrodes and a dummy pattern array. The channel array includes multiple channels, each of which is disposed on a first region of a substrate and extends in a first direction substantially perpendicular to a top surface of the substrate. The charge storage layer structure includes a tunnel insulation layer pattern, a charge storage layer pattern and a blocking layer pattern which are sequentially formed on a sidewall of each channel in the second direction substantially parallel to the top surface of the substrate. The gate electrodes are arranged on a sidewall of the charge storage layer structure and spaced apart from each other in the first direction. The dummy pattern array includes multiple dummy patterns, each of which is disposed on a second region that is adjacent the first region of the substrate and that extends in the first direction.

In some embodiments, the dummy patterns may include silicon oxide, silicon nitride or polysilicon.

In some embodiments, the dummy patterns may have a circular shape, an elliptical shape or a polygonal shape.

In some embodiments, the dummy patterns may have a line shape which extends in a third direction that is substantially perpendicular to the first and second directions.

In some embodiments, the dummy patterns may have a smaller width than that of the channels.

In some embodiments, the dummy pattern array may include a first dummy pattern column including multiple first dummy patterns formed in a third direction that is substantially perpendicular to the first and second directions and a second dummy pattern column including multiple second dummy patterns formed in the third direction and spaced apart from the first dummy pattern column.

In some embodiments, each dummy pattern may have a top surface that is substantially coplanar with that of each channel.

According to some embodiments, there are provided methods of manufacturing a vertical memory device. In such methods, a sacrificial layer and an insulation layer are formed on a substrate alternately and repeatedly. The substrate has a first region and a second region. Holes and first dummy holes are formed through the sacrificial layers and the insulation layers to expose a top surface of the substrate in the first region and the second region, respectively. Multiple first dummy patterns are formed to fill the first dummy holes. A blocking layer pattern, a charge storage layer pattern, a tunnel insulation layer pattern and a channel are sequentially formed on a sidewall of each hole. Multiple gaps are formed by removing the sacrificial layers to expose a sidewall of each blocking layer pattern. A gate electrode is formed to fill each gap.

In some embodiments, the first dummy patterns may have a circular, elliptical, polygonal shape or a line shape which extends in third direction that is substantially parallel to the top surface of the substrate.

In some embodiments, the first dummy patterns may include silicon oxide, silicon nitride or polysilicon.

In some embodiments, the substrate may further include a third region that is adjacent the first region. When the holes and the first dummy holes are formed, second dummy holes may further be formed in the third region of the substrate. When the first dummy pattern is formed, a second dummy pattern may be further formed to fill each second dummy hole.

In some embodiments, prior to forming the gaps by removing the sacrificial layers, portions of the insulation layers and the sacrificial layers in the third region of the substrate may be further removed. The entire second dummy patterns may be further removed.

In some embodiments, each first dummy hole may have a smaller width than that of each hole.

In some embodiments, multiple first dummy patterns may be formed in a third direction that is substantially parallel to the top surface of the substrate to define a dummy pattern column.

In some embodiments, when the holes and the first dummy holes are formed, a first hole column including multiple first holes may be formed, each of which extends in a first direction that is substantially perpendicular to the top surface of the substrate and is formed in a central portion of the first region of the substrate in a third direction that is substantially parallel to the top surface of the substrate. A second hole column spaced apart from the first hole column in a second direction that is substantially perpendicular to the third direction and that includes multiple second holes may be formed, each of which is formed in an edge portion of the first region of the substrate in the third direction. A third hole column arranged between the first and the second hole columns and including multiple third holes may be formed, each of which is formed in a fourth direction that may be an oblique angle to the second from the first holes.

According to some embodiments, the vertical memory device includes channels and gate structures at a first region I of a substrate, and a dummy pattern at a second region II of the substrate. When holes for the channels are formed, dummy holes corresponding to the holes are formed, simultaneously. The dummy holes and/or the holes may be etched evenly.

Some embodiments include a vertical memory device that includes multiple channels disposed in a first region of a substrate and extending in a first direction that is substantially perpendicular to a top surface of the substrate. A charge storage layer structure may be formed on a sidewall of ones of the channels in a second direction that is substantially parallel to the top surface of the substrate and that is different from the first direction. Multiple gate electrodes may be arranged on a sidewall of the charge storage layer structure and spaced apart from each other in the first direction and multiple dummy patterns, one of which are disposed in a second region that is adjacent the first region of the substrate and that extend in the first direction.

In some embodiments, ones of the dummy patterns include silicon oxide, silicon nitride and/or polysilicon. Some embodiments provide that ones of the dummy patterns have a line shape which extends in a third direction that is substantially perpendicular to the first and second directions. In some embodiments, ones of the dummy patterns have a smaller width than a width of ones of the channels. Some embodiments provide that the first dummy patterns include a first dummy pattern column including multiple first dummy patterns formed in a third direction that is substantially perpendicular to the first and second directions and a second dummy pattern column including multiple second dummy patterns formed in the third direction and spaced apart from the first dummy pattern column. In some embodiments, ones of the dummy patterns have a top surface that is substantially coplanar with a top surface of ones of the plurality of channels.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following detailed description taken in conjunction with the accompanying drawings. FIGS. 1 to 17 represent non-limiting, example embodiments as described herein.

FIG. 1 is a perspective view illustrating a vertical memory device in accordance with some embodiments.

FIG. 2 is a vertical cross-sectional view illustrating the vertical memory device of FIG. 1, FIG. 3 is a local perspective view illustrating the vertical memory device of FIG. 1.

FIGS. 4A to 12A are vertical cross-sectional views illustrating methods of manufacturing a vertical memory device in accordance with some embodiments.

FIGS. 5B, 7B, 8B, 9B and 12B are horizontal cross-sectional views illustrating methods of manufacturing a vertical memory device in accordance with some embodiments.

FIG. 6B is a local perspective view illustrating methods of manufacturing a vertical memory device in accordance with some embodiments.

FIG. 13 is a horizontal cross-sectional view illustrating methods of manufacturing a vertical memory device in accordance with example embodiments.

FIG. 14 is a horizontal cross-sectional view illustrating methods of manufacturing a vertical memory device in accordance with example embodiments.

FIG. 15 is a horizontal cross-sectional view illustrating methods of manufacturing a vertical memory device in accordance with example embodiments.

FIGS. 16A and 17 are horizontal cross-sectional views illustrating methods of manufacturing a vertical memory device in accordance with example embodiments.

FIGS. 16B and 16C are vertical cross-sectional views illustrating methods of manufacturing the vertical memory device.

DETAILED DESCRIPTION

Figure 1:
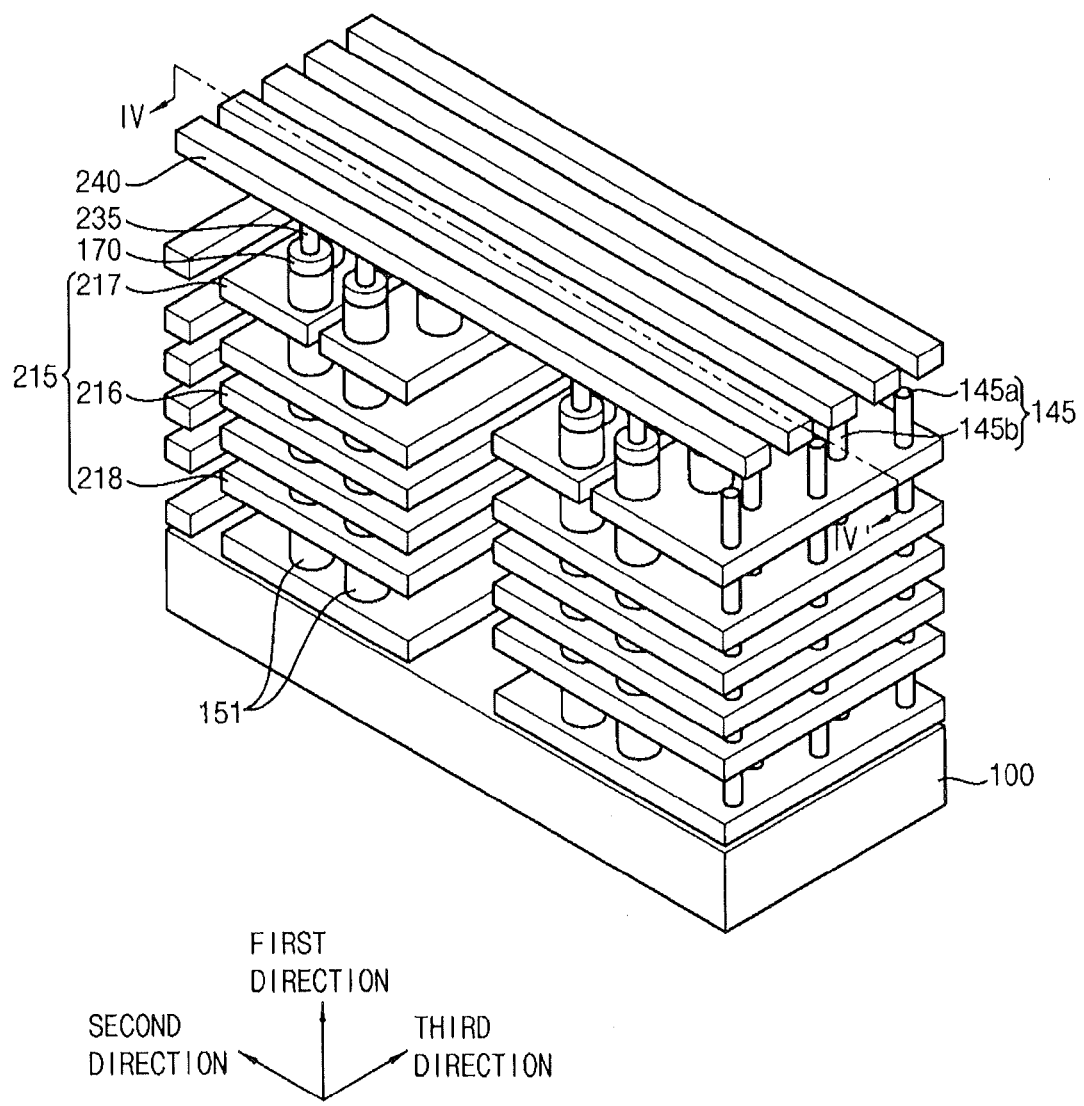

Example embodiments will now be described more fully with reference to the accompanying drawings, in which example embodiments are shown. Example embodiments may, however, be embodied in many different forms and should not be construed as limited to the example embodiments set forth herein. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
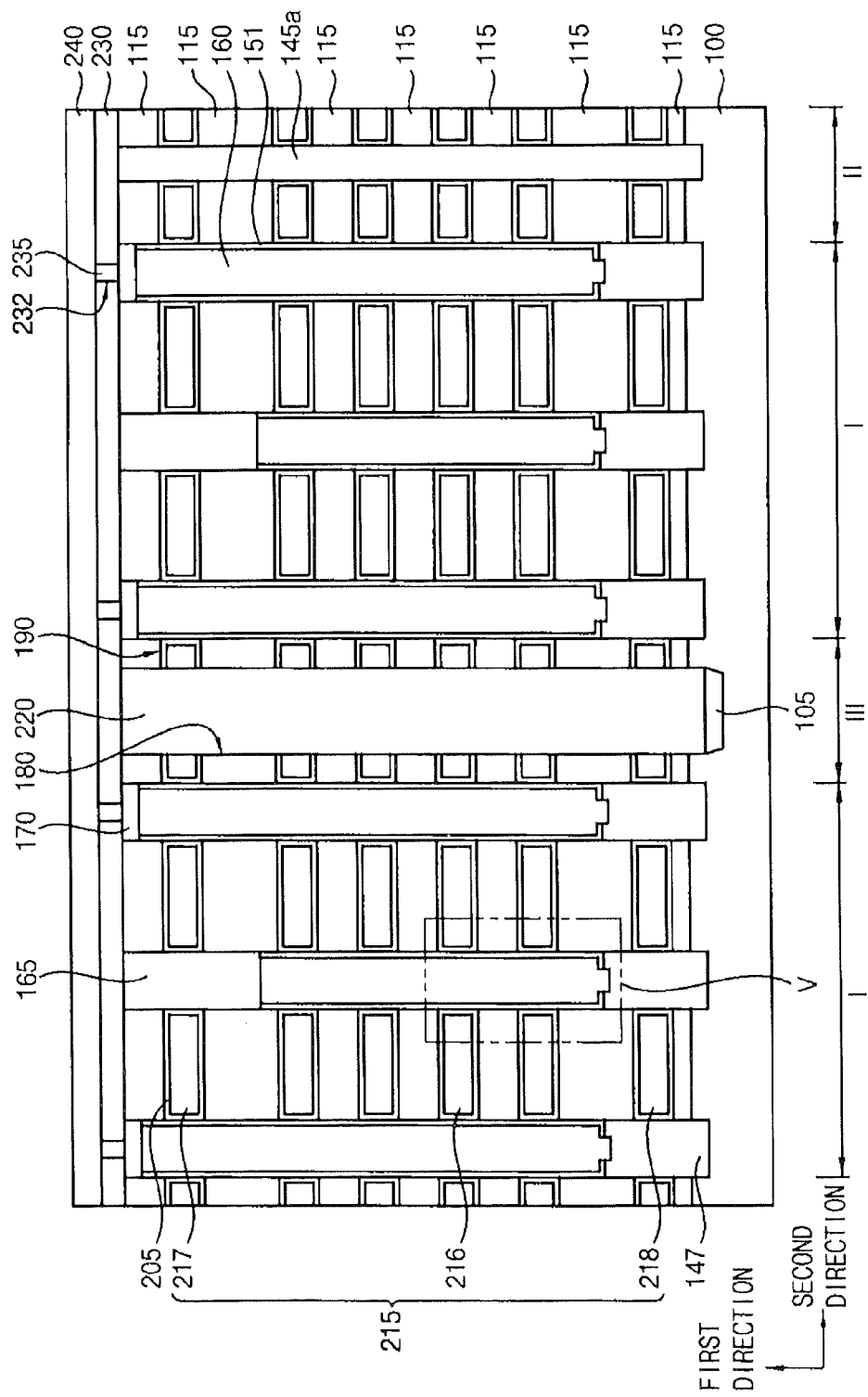
Figure 3:
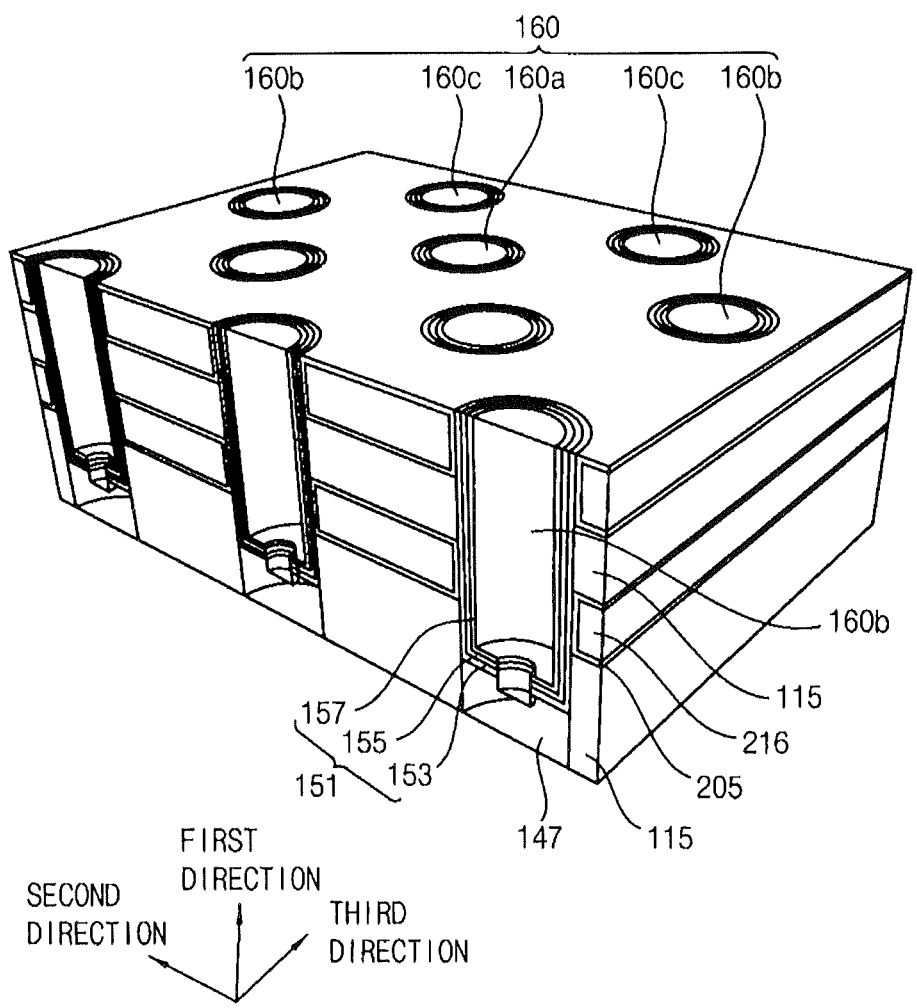

FIG. 1 is a perspective view illustrating a vertical memory device in accordance with some embodiments. FIG. 2 is a vertical cross-sectional view cut along the line VI-VI' in FIG. 1. FIG. 3 is a local perspective view of a region V of the vertical memory device in FIG. 2.

For the convenience of the explanation, FIG. 1 does not show all elements of the vertical memory device, but only shows some elements thereof, e.g., a substrate, a semiconductor pattern, a channel, a gate electrode, a pad, a bit line contact and a bit line. In the figures in this specification, a direction substantially perpendicular to a top surface of the substrate is referred to as a first direction, and two directions substantially parallel to the top surface of the substrate and substantially perpendicular to each other are referred to as a second direction and a third direction. Additionally, a direction indicated by an arrow in the figures and a reverse direction thereto are considered as the same direction.

Referring to FIGS. 1 to 3, the vertical memory device may include a plurality of channels 160 each of which may extend in the first direction on a substrate 100, a first tunnel insulation layer pattern 157, a charge storage layer pattern 155 and a blocking layer pattern 153 sequentially stacked on an outer sidewall of each channel 160. The vertical memory device may further include an auxiliary blocking layer pattern 205 that may be sequentially stacked on and may surround a portion of the outer sidewall of each channel 160.

Additionally, the vertical memory device may include a plurality of gate electrodes 216, 217 and 218 that may be formed on an outer sidewall of the auxiliary blocking layer pattern 205 and partially cover outer sidewalls of some channels 160. The vertical memory device may further include an impurity region 105 serving as a common source line (CSL) 105 and a bit line 240.

The substrate 100 may include a semiconductor material, e.g., silicon, germanium, etc. The substrate 100 may include a first region I, a second region II and a third region III. In some embodiments, vertical memory elements including the channels 160 may be formed in the first region I. A plurality of first regions I may be formed in the second direction, and each of the first regions I may extend in the third direction. The third region III may be arranged between the first regions I. In some embodiments, the third region III may be a word line cut region to separate the vertical memory elements. The second region II may be arranged adjacent the first region I.

Each channel 160 may extend in the first direction in the first region I. In some embodiments, each channel 160 may have a pillar shape. In some embodiments, each channel 160 may have a cup shape of which a central bottom is opened. In this case, a space defined by an inner wall of each channel 160 may be filled with an insulation pattern (not shown). In some embodiments, each channel 160 may include doped and/or undoped polysilicon and/or single crystalline silicon.

In some embodiments, the plurality of channels 160 may be arranged in both of the second and third directions, and thus a channel array may be defined.

In some embodiments, the channel array may have a first channel column including a plurality of first channels 160a arranged in the third direction, a second channel column including a plurality of second channels 160b arranged in the third direction and a third channel column including a plurality of third channels 160c arranged between the first and second channels 160a and 160b. The first channels 160a may be arranged at a central portion of the first region I in the third direction. The second channels 160b may be arranged at outer portions of the first region I in the third direction. The third channels 160c may be positioned in a fourth direction, which may be an oblique angle to the second direction or the third direction, from the first or the second channels 160a or 160b. Accordingly, the first, second and third channels 160a, 160b and 160c may be arranged in a zigzag pattern (that is, a staggered pattern) with respect to the third direction, and thus more channels may be arranged in a given area.

The first to third channel columns may define a channel set, and a plurality of the channel sets may be repeatedly arranged in the second direction to form the channel array. In some embodiments, one channel set may be arranged to correspond one first region I.

Referring to FIG. 3, each of the tunnel insulation layer patterns 157, the charge storage layer patterns 155 and the blocking layer patterns 153, that may be sequentially stacked on and may surround the outer sidewalls of each channel 160, may have a cup shape of which a central bottom may be opened in accordance with the shape of each of the channels 160. Particularly, the tunnel insulation layer pattern 157, the charge storage layer pattern 155 and the blocking layer pattern 153 may surround an outer sidewall and a bottom of each channel 160. Accordingly, the tunnel insulation layer pattern 157, the charge storage layer pattern 155 and the blocking layer pattern 153 may define a charge storage layer structure 151. In some embodiments, a plurality of charge storage layer structures 151 may be formed, each of which is corresponded to each channel 160.

In some embodiments, the tunnel insulation layer pattern 157 may include an oxide, e.g., silicon oxide, the charge storage layer pattern 155 may include a nitride, e.g., silicon nitride, and the blocking layer pattern 153 may include an oxide, e.g., silicon oxide.

A semiconductor pattern 147 making contact with the top surface of the substrate 100 may be formed beneath each channel 160. Accordingly, as the channel 160 may have a portion at a bottom thereof protruding from the charge storage layer structure 151, the semiconductor pattern 147 may have a concave portion at a top surface thereof. The semiconductor pattern 147 may directly contact the channel 160 through the protrusion portion thereof. In some embodiments, the semiconductor pattern 147 may include doped and/or undoped polysilicon, single crystalline polysilicon, doped and/or undoped polygermanium and/or single crystalline germanium.

Additionally, a pad 170 may be formed on top surfaces of the channel 160 and the charge storage layer structure 151. In some embodiments, the pad 170 may include doped and/or undoped polysilicon and/or single crystalline silicon.

A plurality of first insulation patterns 115 may be formed in the first direction on sidewalls of the blocking layer patterns 153, respectively. For example, each first insulation pattern 115 may include silicon oxide.

A first opening 180 may be formed between the channel sets in the third region III, and a space between the first insulation layers 115 at each level may be defined as a gap 190.

The auxiliary blocking layer pattern 205 may surround a sidewall of the blocking layer pattern 153 exposed by the gap 190, that is, may surround an outer sidewall of the channel 160. Thus, portions of the outer sidewalls of the channels 160 may be surrounded by the auxiliary blocking layer pattern 205. The auxiliary blocking layer pattern 205 may be further formed on an inner wall of the gap 190. Top and bottom end portions of the auxiliary blocking layer pattern 205 may extend in both of the second and third directions. The auxiliary blocking layer pattern 205 may include, e.g., aluminum oxide and/or silicon oxide.

The plurality of gate electrodes 216, 217 and 218 may be formed on a sidewall of the auxiliary blocking layer pattern 205 and may fill an inner portion of the gap 190. In some embodiments, the plurality of gate electrodes 216, 217 and 218 may extend in the third direction.

The plurality of gate electrodes 216, 217 and 218 may include a ground selection line (GSL) 218, a word line 216 and a string selection line (SSL) 217 that are spaced apart from each other along the first direction.

Each of the GSL 218, the word line 216 and the SSL 217 may be at a single level (e.g., one of each, each at a different height) or more than one level, and each of the first insulation layer patterns 115 may be interposed therebetween. In some embodiments, the GSL 218 and the SSL 217 may be at one level (e.g., two of each at different heights), respectively, and the word line 216 may be at 4 levels between the GSL 218 and the SSL 217. However, the GSL 218 and the SSL 217 may be at two levels, and the word line 216 may be formed at 2, 8 or 16 levels.

In some embodiments, the plurality of gate electrodes 216, 217 and 218 may include, for example, a metal and/or a metal nitride. For example, the plurality of gate electrodes 216, 217 and 218 may include a metal and/or a metal nitride with low electrical resistance (e.g., tungsten, tungsten nitride, titanium, titanium nitride, tantalum, tantalum nitride and/or platinum.)

Accordingly, the charge storage layer structure 151 and the plurality of gate electrodes 216, 217 and 218 may define a gate structure. A plurality of gate structures may be formed in the first direction.

The gate structures may be divided by a division layer pattern 165 extending in the third direction and penetrating a portion of the first insulation layer patterns 115. The division layer pattern 165 may be arranged to overlap the first channel column. The channels 160 may be divided by the division layer pattern 165 in the third direction.

Particularly, the division layer pattern 165 may penetrate the SSL 217 and the first insulation layer patterns 115 thereon, and may further penetrate a portion of the first insulation layer pattern 115 therebeneath. Thus, the SSL 217 may be electrically insulated from each other by the division layer pattern 165. The division layer pattern 165 may include an oxide, e.g., silicon oxide.

The first opening 180 between the first regions I of the substrate 100 may be filled with a second insulation layer pattern 220. The second insulation layer pattern 220 may include an oxide, e.g., silicon oxide.

The impurity region 105 serving as a common source line (CSL) and extending in the third direction may be formed at an upper portion of the substrate 100 beneath the second insulation layer pattern 220. In some embodiments, the impurity region 105 may include n-type impurities, e.g., phosphorus, arsenic, and the like. For example, a cobalt silicide pattern (not shown) or nickel silicide pattern (not shown) may be further formed on the impurity region 105.

Referring now to FIGS. 1 and 2, a first dummy pattern 145a and a second dummy pattern 145b may be arranged in the second region II adjacent to the first region I. Each of the first and second dummy patterns 145a and 145b may extend in the first direction. For example, the first and second dummy patterns 145a and 145b may have a pillar shape, and may have a top surface substantially coplanar with the top surface of the channel 160. The first and second dummy patterns 145a and 145b may have a smaller width than that of the channels 160.

In some embodiments, a plurality of first dummy patterns 145a and a plurality of second dummy patterns 145b may be formed in the second and third directions, respectively. Accordingly a dummy pattern array may be defined.

In some embodiments, the dummy pattern array may have a first dummy pattern column including the plurality of first dummy patterns 145a arranged in the third direction and a second dummy pattern including the plurality of second dummy patterns 145b arranged in the third direction. The second dummy patterns 145b may be positioned in the fourth direction, which may be an oblique angle to the second or third direction, from the first dummy patterns 145a. Accordingly, the first and second dummy patterns 145a and 145b may be arranged in a zigzag pattern (a staggered pattern) with respect to the third direction.

For example, the first and second dummy patterns 145a and 145b may include silicon oxide, silicon nitride or polysilicon.

The bit line 240 may be electrically connected to the pad 170 via a bit line contact 235, and thus may be electrically connected to the channels 160. The bit line 240 may include a metal, a metal nitride, doped polysilicon, and the like. In some embodiments, the bit line 240 may extend in the second direction, and a plurality of bit lines 240 may be formed in the third direction.

The bit line contact 235 may fill a second opening 232 through a third insulation layer 230, and make contact with a top surface of the pad 170. The bit line contact 235 may include a metal, a metal nitride, doped polysilicon, and the like.

The third insulation layer 230 may be formed on the first and second insulation layer patterns 115 and 220, the pad 170 and the division layer pattern 165. In some embodiments, the third insulation layer 230 may include an insulating material, e.g., oxide.

As illustrated above, the vertical memory device may have the channels 160 and the gate structures in the first region I of the substrate 100, and the dummy patterns 145a and 145b in the second region II of the substrate 100. When holes 130 (See FIG. 5A) for the channels 160 are formed, dummy holes 140a and 140b (See FIG. 5A) in accordance with the dummy patterns 145a and 145b may be formed, simultaneously. The dummy holes 140a and 140b may be formed to form and arrange the holes 130 uniformly. Accordingly, the vertical memory device may have a good reliability.

FIGS. 4A to 12A are vertical cross-sectional views illustrating methods of manufacturing vertical memory devices in accordance with some embodiments, FIGS. 5B, 7B, 8B, 9B and 12B are plan views illustrating methods of manufacturing the vertical memory devices, and FIG. 6B is a local perspective view illustrating methods of manufacturing the vertical memory devices. The vertical cross-sectional views are cross-sectional views cut along the line VI-VI' of the plan views. The figures show methods of manufacturing the vertical memory devices of FIGS. 1 to 3, however, may not be limited thereto.

Referring to FIG. 4A, a first insulation layer 110 and a sacrificial layer 120 may be alternately and repeatedly formed on a substrate 100. A plurality of first insulation layers 110 and a plurality of sacrificial layers 120 may be alternately formed on each other at a plurality of levels, respectively.

The substrate 100 may include a semiconductor material, for example, silicon and/or germanium. The substrate 100 may be divided into a first region I, a second region II and a third region III in accordance with positions. In some embodiments, a vertical memory element including channels 160 in FIG. 7A may be in the first region I. A plurality of first regions I may be formed in the second direction, each of which may extend in the third direction. The third region III may be arranged between the first regions I, and may be a word line cut region to separate the vertical memory elements. The second region II may be arranged adjacent a surface of the first region I.

In some embodiments, the first insulation layer 110 and the sacrificial layer 120 may be formed by, for example, a chemical vapor deposition (CVD) process, a plasma enhanced chemical vapor deposition (PECVD) process and/or an atomic layer deposition process (ALD) process. A lowermost first insulation layer 110, which may be formed directly on a top surface of the substrate 100, may be formed by, for example, a thermal oxidation process. In some embodiments, the first insulation layer 110 may be formed to include a silicon oxide. The sacrificial layers 120 may be formed to include, for example, a material with etch selectivity to the first insulation layer 110 (e.g., silicon nitride).

The number of the first insulation layers 110 and the number of the sacrificial layers 120 stacked on the substrate 100 may vary according to the desired number of a GSL 218, a word line 216 and a SSL 217 (refer to FIG. 11A). According to some embodiments, each of the GSL 218 and the SSL 217 may be formed at a single level, and the word line 216 may be formed at 4 levels. The sacrificial layer 120 may be formed at 6 levels, and the first insulation layer 110 may be formed at 7 levels. According to some embodiments, each of the GSL 218 and the SSL 217 may be formed at two levels, and the word line 216 may be formed at 2, 8 or 16 levels. The number of the first insulation layers 110 and the number of the sacrificial layers 120 may vary according to this case. However, the number of GSLs 218, SSLs 217 and word lines 216 may not be limited herein.

Figure 5A:
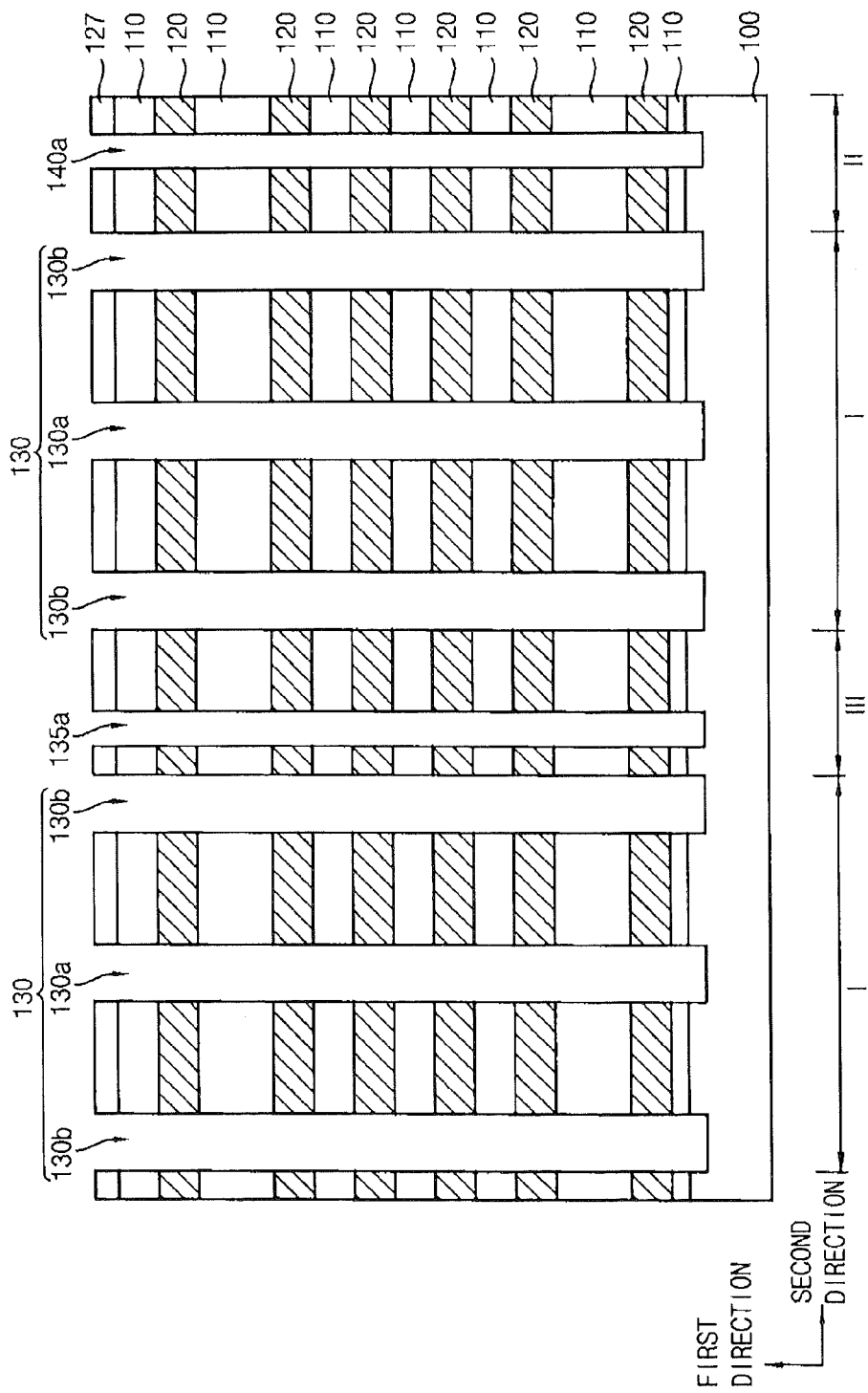
Figure 5B:
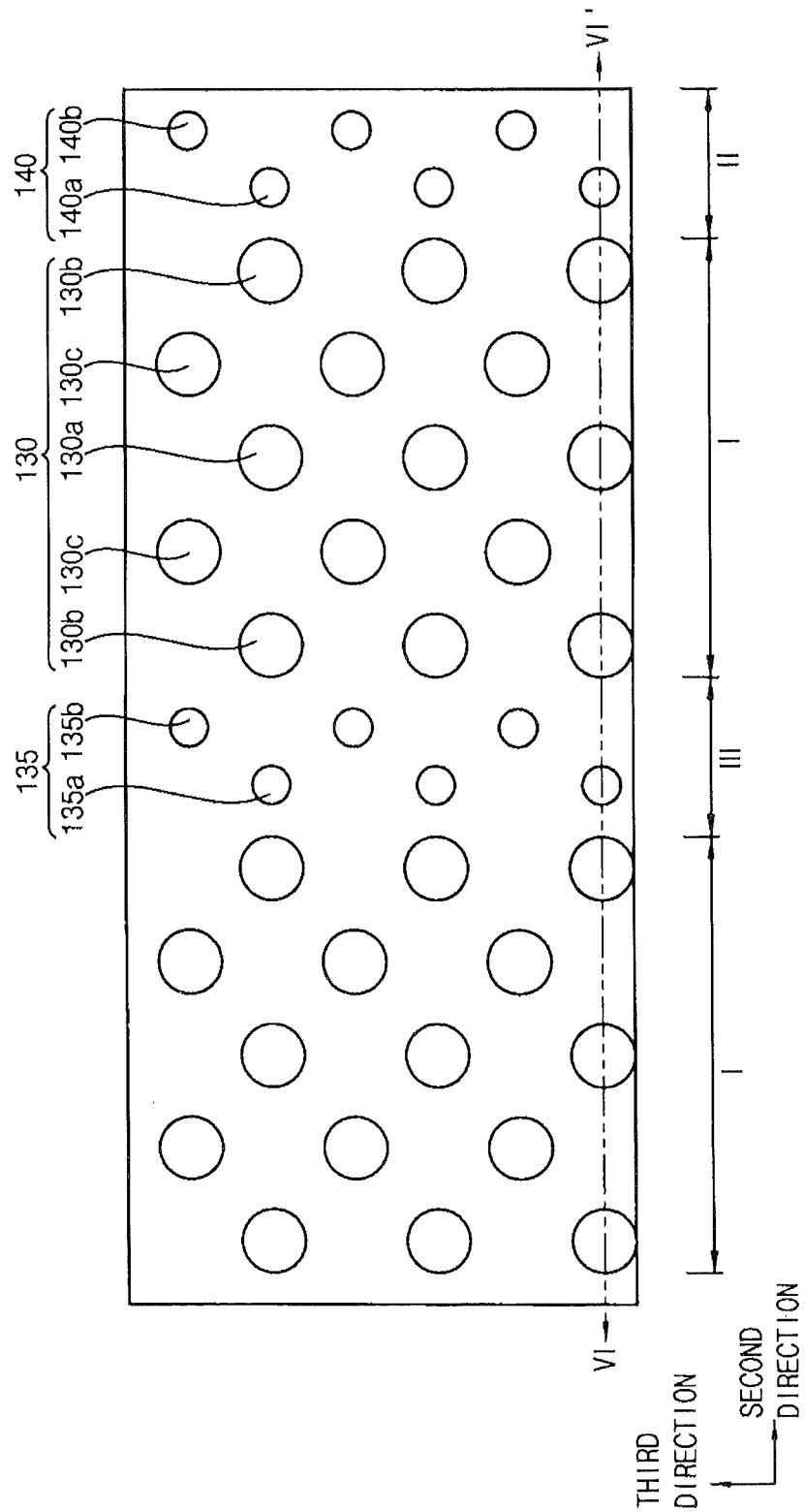

Referring to FIGS. 5A and 5B, a plurality of holes 130 and a plurality of dummy holes 135 and 140 may be formed through the first insulation layers 110 and the sacrificial layers 120 to expose a top surface of the substrate 100.

In some embodiments, after forming a hard mask 127 on the uppermost first insulation layer 110, the first insulation layers 110 and the sacrificial layers 120 may be dry etched using the hard mask 127 as an etch mask to form the holes 130 and the dummy holes 135 and 140. The holes 130 and the dummy holes 135 and 140 may extend in the first direction. Due to the characteristics of a dry etch process, the holes 130 and the dummy holes 135 and 140 may be of a width that becomes gradually smaller from a top portion to a bottom portion thereof.

In some embodiments, the hard mask 127 may be formed to include a material with etch selectivity to silicon oxide and silicon nitride that may be included in the first insulation layers 110 and the sacrificial layers 120, respectively, e.g., polysilicon or amorphous silicon by a chemical vapor deposition (CVD) process, a plasma enhanced chemical vapor deposition (PECVD) process, an atomic layer deposition (ALD) process, and the like.

In some embodiments, a plurality of holes 130a, 130b and 130c may be arranged in the second and third directions in the first region I. A plurality of first and second dummy holes 140a and 140b may be arranged in the third direction in the second II, and a plurality of third and fourth dummy holes 135a and 135b may be arranged in the third direction in the third region III.

The holes 130a, 130b and 130c formed in the first region I may define a hole array. In some embodiments, the hole array may have a first hole column including the plurality of first holes 130a arranged in the third direction, a second hole column including the plurality of second holes 130b arranged in the third direction and a third hole column including the plurality of third holes 130c arranged between the first and second holes 130a and 130b. The first holes 130a may be arranged at a central portion of the first region I in the third direction. The second holes 130b may be arranged at outer portions of the first region I in the third direction. The third holes 130c may be positioned in a fourth direction, which may be an oblique angle to the second direction or the third direction, from the first or the second holes 130a or 130b. Accordingly, the first, second and third holes 130a, 130b and 130c may be arranged in a zigzag pattern with respect to the third direction, and thus more holes 130 may be arranged in a given area.

The first and second dummy holes 140a and 140b may be formed in the second region II. In some embodiments, the plurality of the first and second dummy holes 140a and 140b may be arranged in the second and third directions. Accordingly, a first dummy hole array may be defined.

In some embodiments, the first dummy hole array may have a first dummy hole column including the plurality of first holes 140a arranged in the third direction and a second dummy hole column including the plurality of second holes 130b arranged in the third direction. The second dummy holes 140b may be positioned in the fourth direction, which may be an oblique angle to the second direction or the third direction, from the first dummy holes 140a. Accordingly, the first and second dummy holes 140a and 140b may be arranged in a zigzag pattern with respect to the third direction.

In some embodiments, the first and second dummy holes 140a and 140b may have a diameter substantially the same as or smaller than that of the holes 130.

The plurality of third and fourth dummy holes 135a and 135b may be formed in the third region III. In some embodiments, the plurality of third and fourth dummy holes 135a and 135b may be arranged in the second and third directions. Accordingly, the third and fourth dummy holes 135a and 135b may be arranged in a zigzag pattern.

When the holes 130 are formed, the first to fourth dummy holes 140a, 140b, 135a and 135b may be formed, simultaneously. The first to fourth dummy holes 140a, 140b, 135a and 135b may be formed in the second and third regions II and III, where the holes 130 are not formed. In an etching process for forming the holes 130, it may be etched unevenly depending on existence of other holes adjacent the holes 130.

If the first to fourth dummy holes 140a, 140b, 135a and 135b are not formed, the first holes 130a may be surrounded by the third holes 130c in both directions. While, the second holes 130b may be surrounded by the third holes 130c in a single direction. By these differences, the first and second holes 130a and 130b may have different sizes and shapes after the etching process.

In some embodiments, one sidewall of the second holes 130b may be surrounded by the third holes 130c and the other sidewall of the second holes 130b may be surrounded by the dummy holes 140a, 140b, 135a or 135b. Accordingly the first and second holes 130a and 130b may be formed uniformly.

Additionally, the volumes of the first insulation layers 110 and the sacrificial layers 120 may be reduced after the etching process, so that a mis-alignment by a deformation of the first insulation layers 110 and the sacrificial layers 120 may be reduced or prevented.

Referring to FIGS. 6A and 6B, after dummy patterns 145a, 145b, 134a and 134b are formed to fill the dummy holes 140a, 140b, 135a and 135b respectively, a semiconductor pattern 147 may be formed to partially fill each hole 130. Charge storage layers 150 may be formed on an inner wall of each hole 130, a top surface of the semiconductor pattern 147, and a top surface of the hard mask 127.

First, a dummy pattern layer may be formed on the hard mask 127 to sufficiently fill the dummy holes 140a, 140b, 135a and 135b, and the dummy pattern layer may be planarized until a top surface of the hard mask 127 is exposed to form the first to fourth dummy patterns 145a, 146b, 134a and 134b. In some embodiments, the dummy pattern layer may include silicon oxide, silicon nitride and/or polysilicon. When the first to fourth dummy patterns 145a, 145b, 134a and 134b include polysilicon, the first to the fourth dummy patterns 145a, 145b, 134a and 134b may have an etch selectivity with respect to the first insulation layer 110 including silicon oxide and the sacrificial layer 120 including silicon nitride. The first to fourth dummy patterns 145a, 145b, 134a and 134b may be removed selectively in a process for removing the sacrificial layers 120 (refer to FIG. 10) or in a process for etching the first insulation layer 110 (refer to FIG. 9A).

The dummy patterns 145a, 145b, 134a and 134b in accordance with some embodiments may reduce or prevent the first insulation layers 110 or the sacrificial layers 120 from being deformed in subsequent processes.

Figure 13:
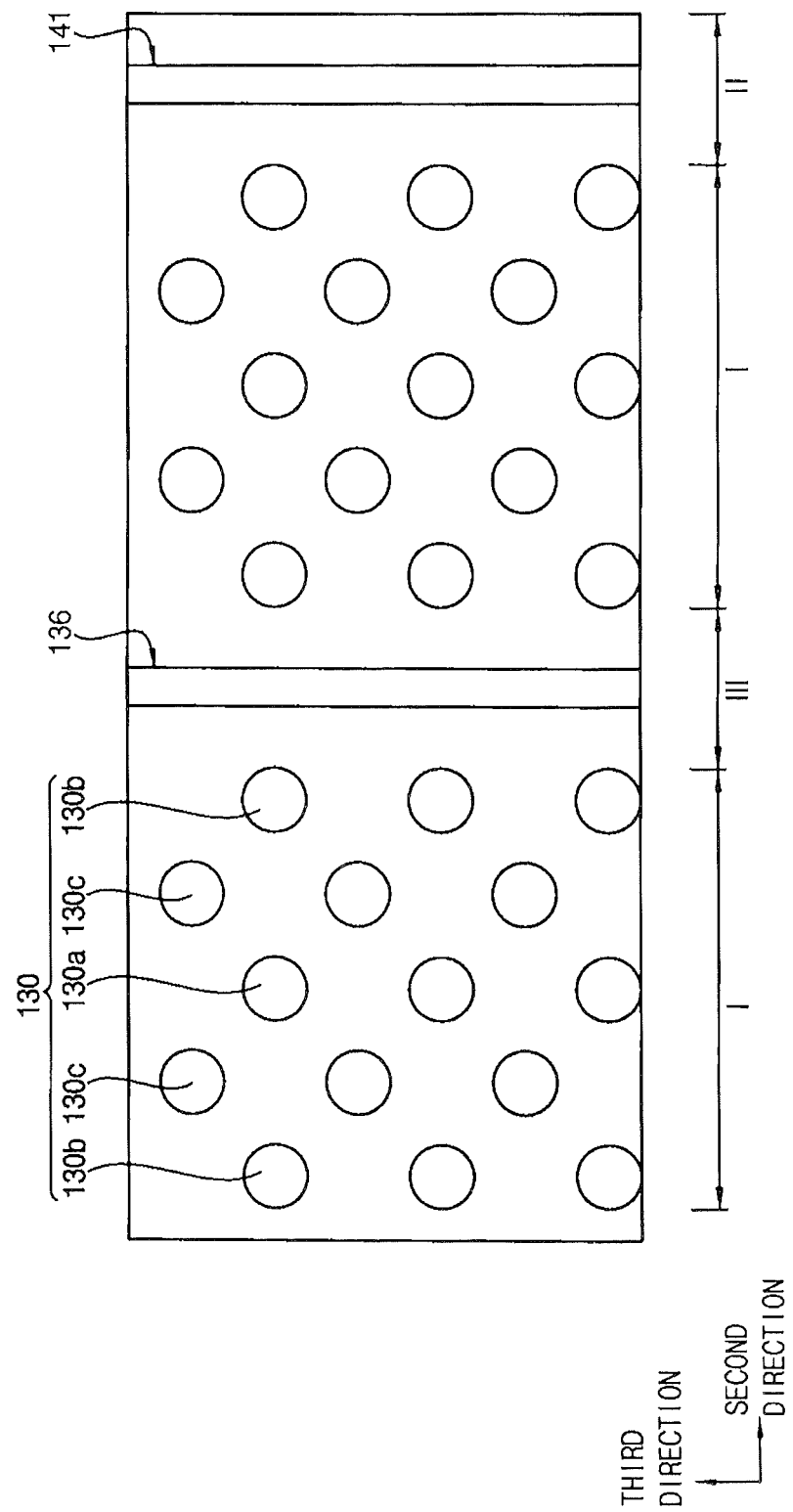
Figure 14:
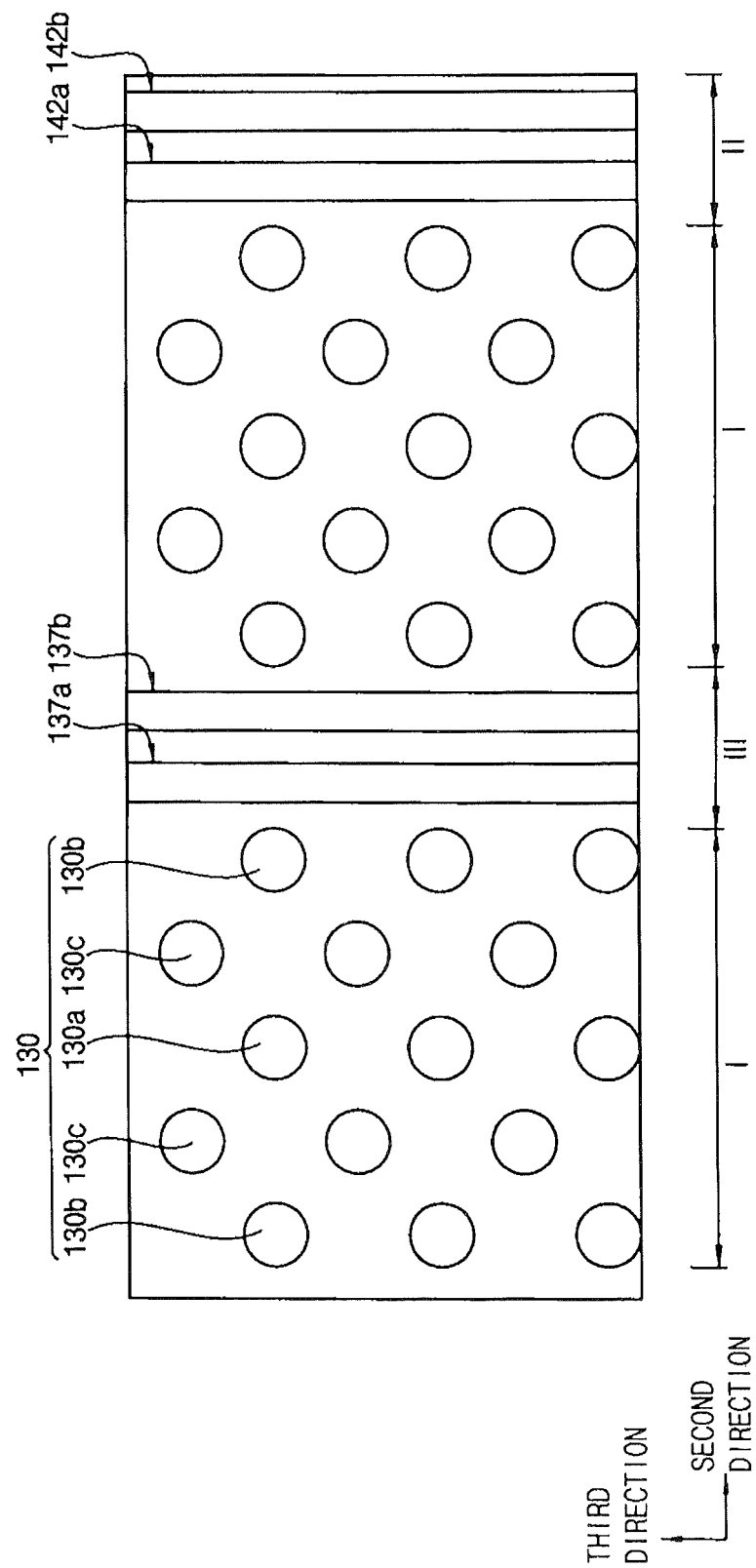

In some embodiments, the dummy patterns 145a, 145b, 134a and 134b may have a plan shape in accordance with that of the dummy holes 140a, 140b, 135a and 135b. As illustrated in FIG. 7B, the plan shape of the dummy patterns 145a, 145b, 134a and 134b may be substantially a circular shape or an elliptical shape. In some embodiments, as illustrated in FIG. 15, when the dummy holes have a polygonal shape extending in the third direction, the dummy patterns may have a polygonal shape extending in the third direction in accordance with these. In some embodiments, as illustrated in FIGS. 13 and 14, when the dummy holes have a line shape extending I the third direction, the dummy patterns may have a line shape extending in the third direction in accordance with these.

Particularly, a selective epitaxial growth (SEG) process may be performed using the exposed top surface of the substrate 100 as a seed to form the semiconductor pattern 147. Thus, the semiconductor pattern 147 may be formed to include single crystalline silicon or single crystalline germanium according to the material of the substrate 100, and in some cases, impurities may be doped thereinto. In some embodiments, an amorphous silicon layer may be formed to fill the holes 130, and a laser epitaxial growth (LEG) process and/or a solid phase epitaxial (SPE) process may be performed on the amorphous silicon layer to form the semiconductor pattern 147. In some embodiments, the semiconductor pattern 147 may be formed to have a top surface higher than that of the sacrificial layer 120, in which the GSL 218 (See FIG. 11) may be formed subsequently.

Referring to FIG. 6B, a blocking layer 152, a charge storage layer 154 and a tunnel insulation layer 156 may be sequentially formed on an inner wall of the holes 130, a top surface of the semiconductor pattern 147, and a top surface of the hard mask 127. That is, the charge storage layers 150 may include the blocking layer 152, the charge storage layer 154 and the tunnel insulation layer 156. In some embodiments, the blocking layer 152 may be formed to include an oxide, e.g., silicon oxide, the charge storage layer 154 may be formed to include a nitride, e.g., silicon nitride, and the tunnel insulation layer 156 may be formed to include an oxide, e.g., silicon oxide.

After forming the tunnel insulation layer 156, an auxiliary channel layer (not shown) may be formed on the tunnel insulation layer 156. The auxiliary channel layer may be formed to include doped and/or undoped polysilicon and/or amorphous silicon. The auxiliary channel layer may prevent the tunnel insulation layer 176 from being damaged during the partial removal of the charge storage layer 154, etc. in a subsequent process (refer to FIG. 7A).

Figure 7A:
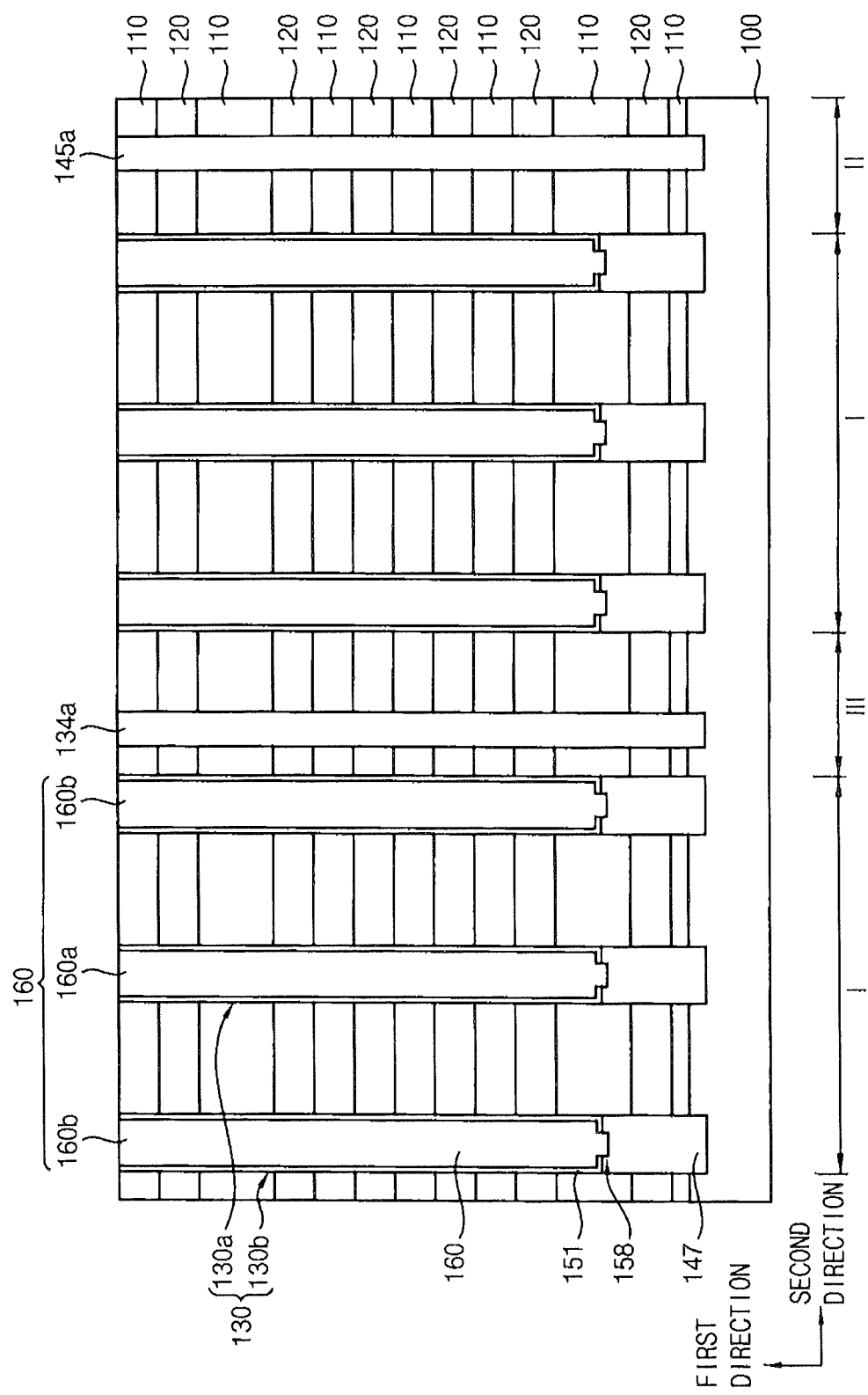

Referring to FIGS. 7A and 7B, a bottom surface of the charge storage layer 150 and an upper portion of the semiconductor pattern 147 may be partially removed to form a first recess 158. Each channel 160 may be formed to sufficiently fill the first recess 158 and a remaining portion of each hole 130.

In some embodiments, a central bottom surface of the charge storage layers 150 (including the tunnel insulation layer 156, the charge storage layer 154 and the blocking layer 152) may be removed to partially expose the upper portion of the semiconductor pattern 147, and the exposed upper portion of the semiconductor portion 147 may be removed to form the first recess 158.

A channel layer may be formed on the charge storage layers 150 and the exposed semiconductor pattern 147 to sufficiently fill remaining portions of the holes 130. The channel layer, the charge storage layers 150 and hard mask 127 may be planarized until a top surface of the uppermost first insulation layer 110 may be exposed. Some embodiments provide that the channel layer may be formed on the charge storage layers 150 and the exposed semiconductor pattern 147. An insulation layer (not shown) may be formed to sufficiently fill the remaining portions of the holes 130.

Thus, the channel 160 and a charge storage layer structure 151 including a blocking layer pattern 153, a charge storage layer pattern 155 and a tunnel insulation layer pattern 157 (refer to FIG. 3) may be formed to fill each hole 130.

In some embodiments, the blocking layer pattern 153, the charge storage layer pattern 155 and the tunnel insulation layer pattern 157 may be formed to have a cup shape of which a central bottom is opened, and may be electrically connected to the semiconductor pattern 147 and the channel 160 via the central bottom surface of the charge storage layers 150 (the tunnel insulation layer 156, the charge storage layer 154 and the blocking layer 152, refer to FIG. 3).

In some embodiments, the channel layer may be formed to include doped and/or undoped polysilicon and/or amorphous silicon. When the channel layer is formed to include amorphous silicon, a crystallization process may be further performed.

The holes 130 for receiving the channels 160 may define a hole set including the first to third holes 130a, 130b and 130c, and further may define a hole array. The channels 160 in accordance with the holes 130 may define a channel set including first to third channels 160a, 160b and 160c, and further a channel array. The first to third channels 160a, 160b and 160c may be formed in the first to third holes 130a, 130b and 130c, respectively.

Figure 8B:
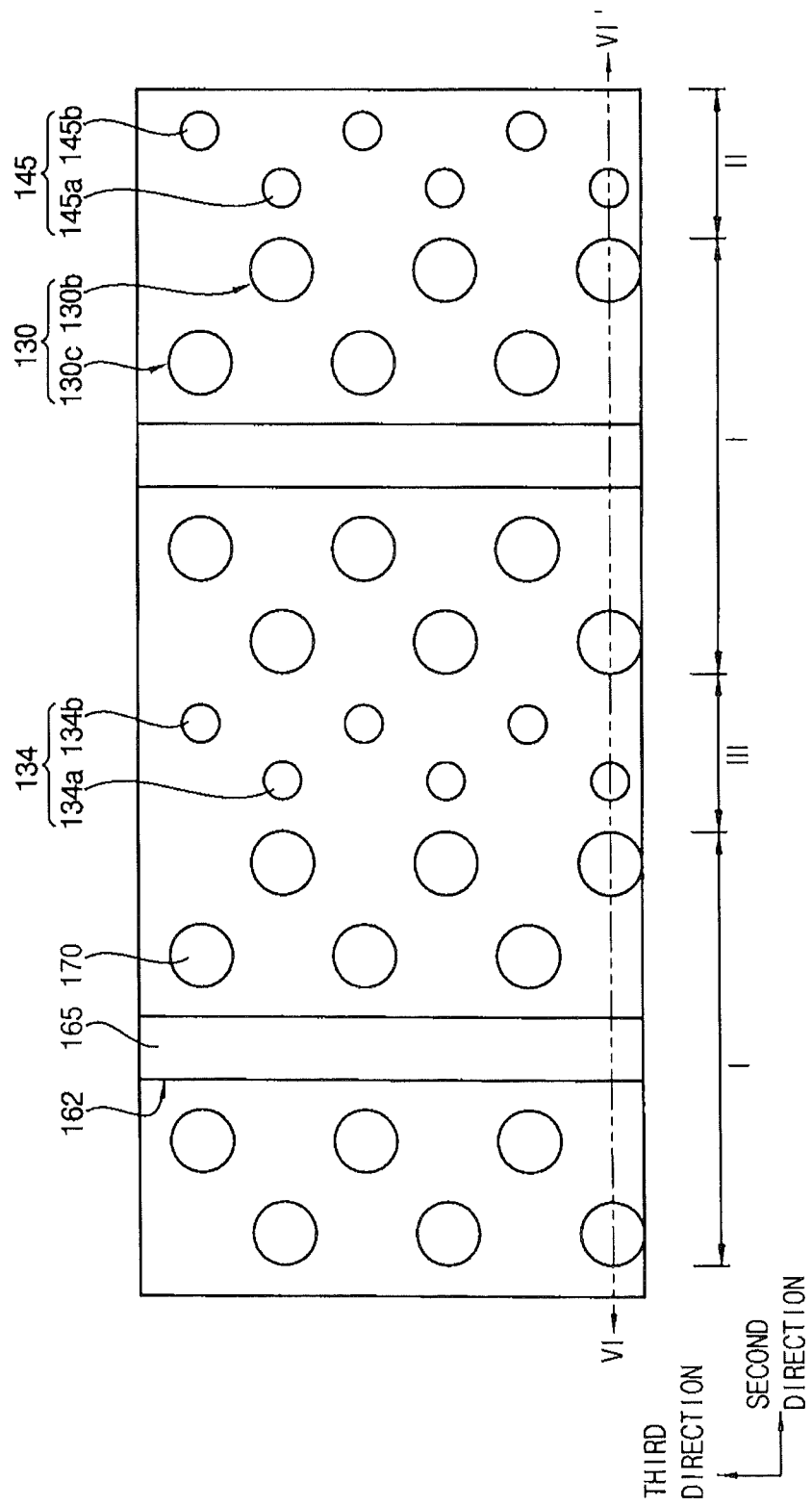

Referring to FIGS. 8A and 8B, the channel 160, the charge storage layer structure 151, the first insulation layers 110 and the sacrificial layers 120 may be partially removed to form a trench 162. A division layer pattern 165 may be formed to fill the trench 162. Upper portions of the channel 160 and the charge storage layer structure 151 may be removed to form a second recess 168. A pad 170 may be formed to fill the second recess 168.

In some embodiments, the trench 162 may be formed to penetrate the sacrificial layers 120 where the SSL 217 (refer to FIG. 11A) are formed and the first insulation layers 110 thereon, and further to penetrate the first insulation layers 110 therebeneath in a lithography process. In some embodiments, the trench 162 may extend in the third direction and may be formed to overlap the first channel 160a.

A division layer may be formed on the first insulation layer 110 to sufficiently fill the trench 162. The division layer may be planarized to form the division layer pattern 165 filling the trench 162 until the top surface of the uppermost first insulation layer 110 is exposed. The division layer may have a material, e.g., silicon oxide, having an etching selectivity with respect to the sacrificial layers 120. The planarization process may be performed by a chemical mechanical polishing (CMP) process and/or an etch back process.

Upper portions of the channel 160, the charge storage layer structure 151 and the blocking layer pattern 153 may be removed by an etch back process to form the second recess 168. A pad layer may be formed on the channel 160, the charge storage layer structure 151 and the uppermost first insulation layer 110 to fill the second recess 168, and the pad layer may be planarized until a top surface of the uppermost first insulation layer 110 is exposed to form the pad 170. In some embodiments, the pad layer may be formed to include amorphous silicon. When the pad layer is formed to include amorphous silicon, a crystallization process may be further performed thereon.

The pad 170 may be formed on each of the channels 160b and 160c, and thus may form a pad array in accordance with the channel array.

Figure 9A:
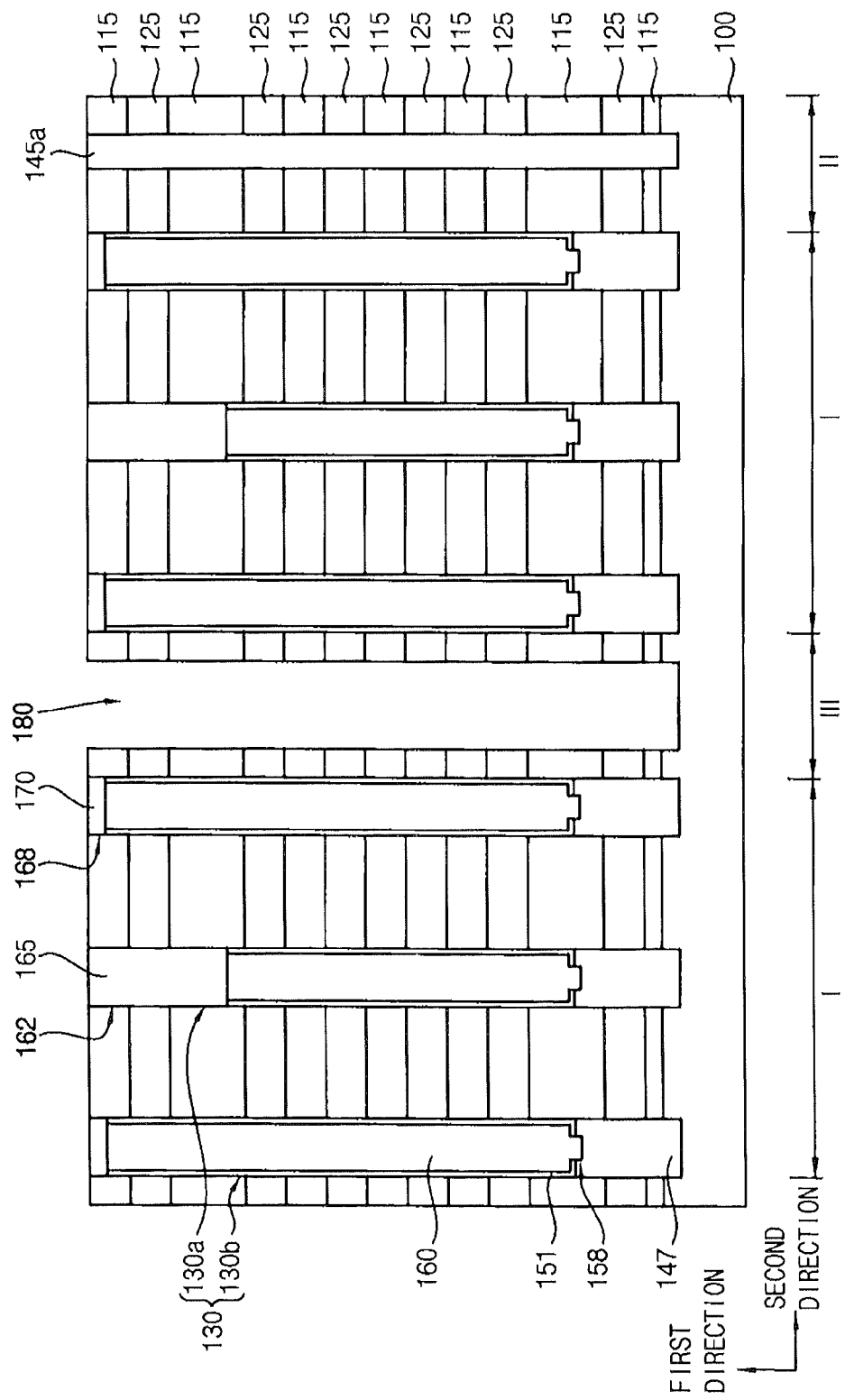

Referring to FIGS. 9A and 9B, a first opening 180 may be formed through the first insulation layers 110 and the sacrificial layers 120 to expose a top surface of the substrate 100.

In some embodiments, after forming a hard mask (not shown) on the uppermost first insulation layer 110, the insulation layers 110 and the sacrificial layers 120 may be, for example, dry etched using the hard mask as an etch mask to form the first opening 180. The first opening 180 may extend in the first direction.

In some embodiments, a plurality of first openings 180 may be formed in the second direction, and each first opening 180 may extend in the third direction. Each first opening 180 may be formed in the third region III between the first regions I. Thus, the third and fourth dummy patterns 134a and 134b in the third region III may be removed during a process for forming the first opening 180.

The first insulation layer 110 and the sacrificial layer 120 may be transformed into a first insulation layer pattern 115 and a sacrificial layer pattern 125, respectively. A plurality of first insulation layer patterns 115 and a plurality of sacrificial layer patterns 125 may be formed in the second direction at each level, and each first insulation layer pattern 115 and each sacrificial layer pattern 125 may extend in the third direction.

Figure 10:
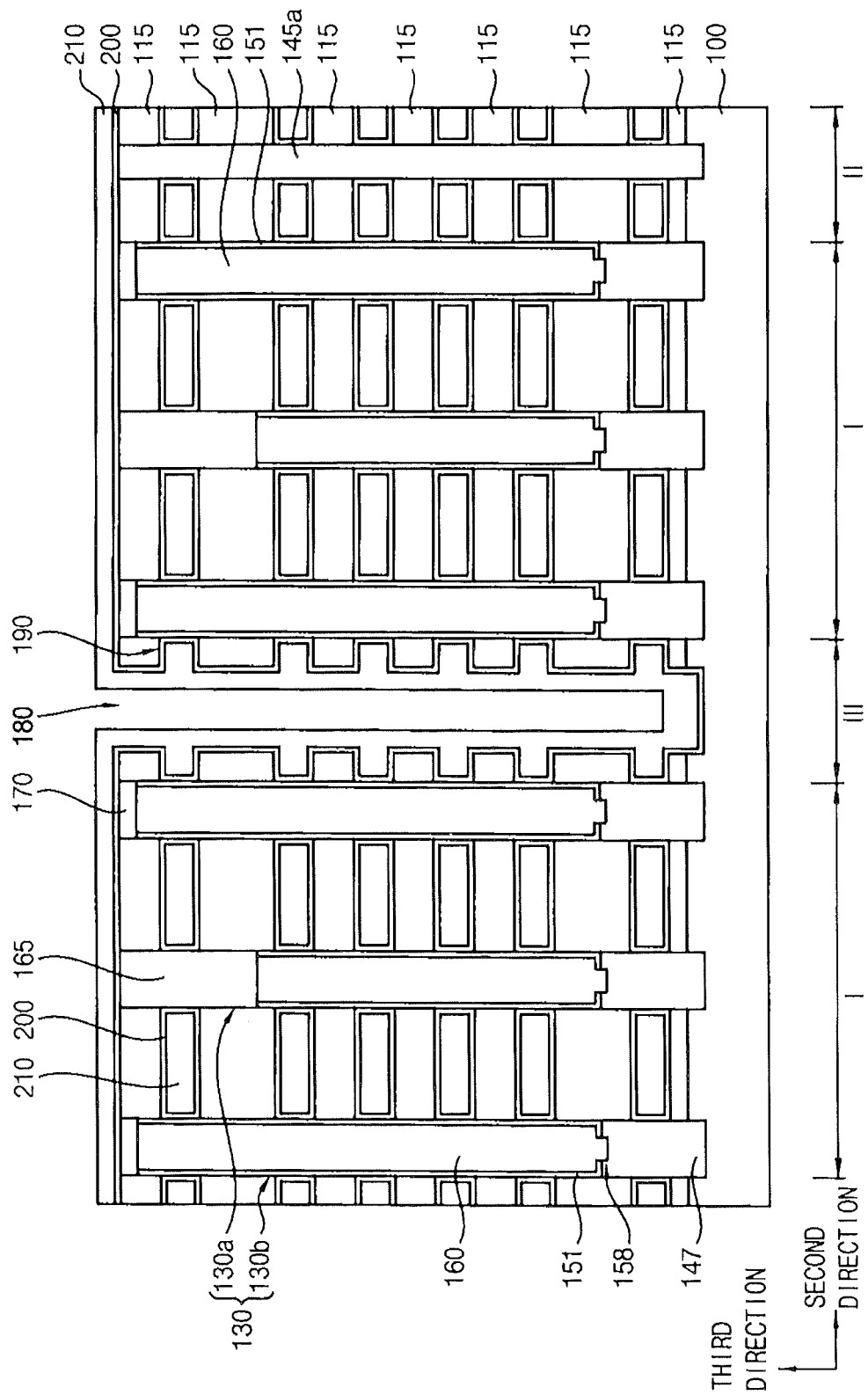

Referring to FIG. 10, the sacrificial layer patterns 125 may be removed to form a gap 190 between the first insulation layer patterns 115 at adjacent levels. An auxiliary blocking layer 200 may be sequentially formed on the exposed portion of the outer sidewall of the blocking layer pattern 152, the exposed portion of the sidewall of the semiconductor pattern 147, an inner sidewall of the gap 190, a surface of the first insulation pattern 115, the exposed top surface of the substrate 100, top surfaces of the pad 170 and the division layer pattern 165. A gate electrode layer 210 may be formed on the auxiliary blocking layer 200 to sufficiently fill the remaining portions of the gap 190.

In some embodiments, the sacrificial layer patterns 125 exposed by the first openings 180 may be removed by, for example, a wet etch process using an etch solution including phosphoric acid and/or sulfuric acid. During the wet etch process, the first and second dummy patterns 145a and 145b may support the first insulation patterns 115. Therefore, the first insulation patterns 115 and the channels 160 may not collapse.

In some embodiments, the auxiliary blocking layer 200 may be formed by a sequentially flow deposition (SFD) process and/or an atomic layer deposition ALD) process.

In some embodiments, the gate electrode layer 210 may be formed to include a metal. For example, the gate electrode 210 may be formed to include a metal of a low resistance, e.g., tungsten, titanium, tantalum, platinum, and the like. When the gate electrode layer 210 is formed to include tungsten, the gate electrode layer 210 may be formed by a CVD process or an ALD process using tungsten hexafluoride ($WF_6$) as a source gas.

Figure 11:
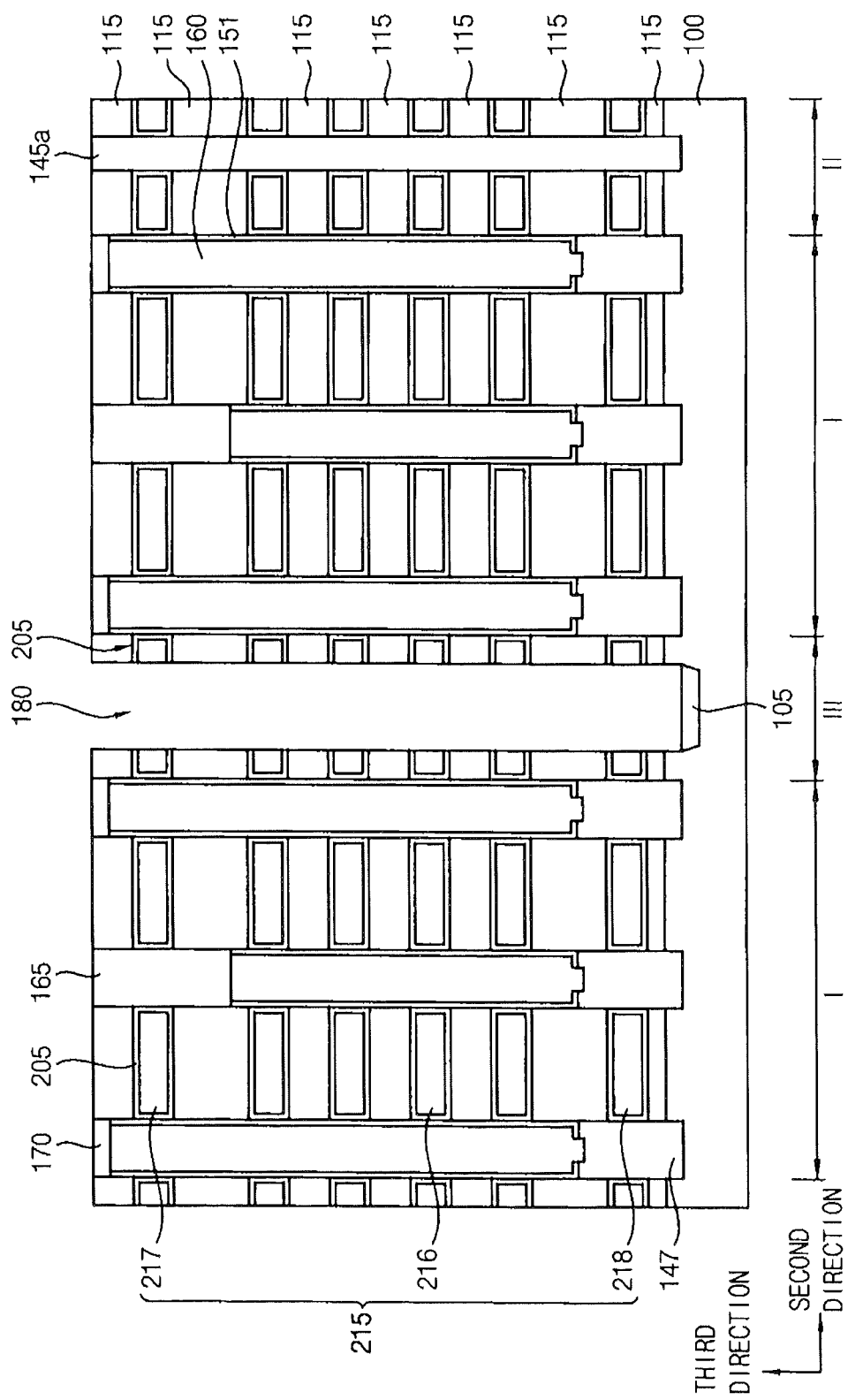

Referring to FIG. 11, the gate electrode layer 210 may be partially removed to form a plurality of gate electrodes 216, 217 and 218.

In some embodiments, the gate electrode layer 210 may be partially removed by, for example, a wet etch process. In some embodiments, the plurality of gate electrodes 216, 217 and 218 may fill the gap 190. The plurality of gate electrodes 216, 217 and 218 may be formed to extend in the third direction.

The plurality of gate electrodes 216, 217 and 218 may include a GSL 218, the word line 216 and the SSL 217 sequentially located from a top surface of the substrate 100. Each of the GSL 218, the word line 216 and the SSL 217 may be formed at a single level or at a plurality of levels. According to some embodiments, each of the GSL 218 and the SSL 217 may be formed at single level, and the word line 216 may be formed at 4 levels between the GSL 218 and the SSL 217. However, the number of GSLs 218, word lines 216 and SSLs 217 may not be limited thereto. The GSL 218 may be formed adjacent the semiconductor pattern 147, the word line 216 and the SSL 217 may be formed adjacent the channels 160, and particularly, the SSL 217 may be formed adjacent the division layer pattern 165.

When the gate electrode layer 210 is partially removed, portions of the auxiliary blocking layer pattern 205 on a surface of the first insulation layer pattern 115 and on top surfaces of the substrate 100, the pad 170 and the division layer pattern 165 may also be removed to form an auxiliary blocking layer pattern 205.

In a process for partially removing the gate electrode layer 210, the auxiliary blocking layer 200 may be partially removed, the first opening 180 exposing a top surface of the substrate 100 and extending in the third direction may be formed again, and impurities may be implanted into the exposed top surface of the substrate 100 to form an impurity region 105. In some embodiments, the impurities may include n-type impurities, for example, phosphorus and/or arsenic. In some embodiments, the impurity region 105 may extend in the third direction and serve as a common source line (CSL).

A metal silicide pattern (not shown), e.g., a cobalt silicide pattern or a nickel silicide pattern may be further formed on the impurity region 105.

Figure 12A:
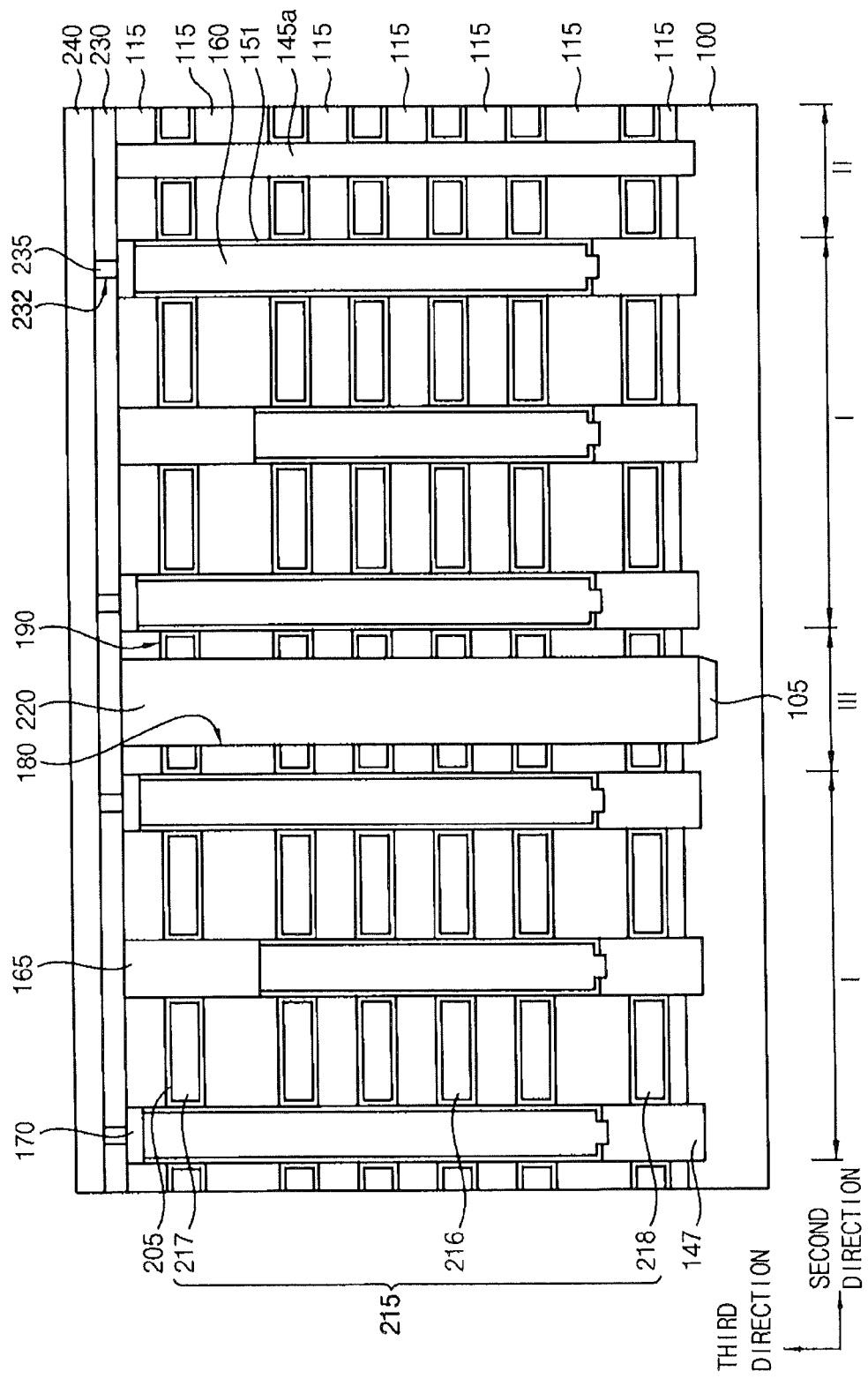
Figure 12B:
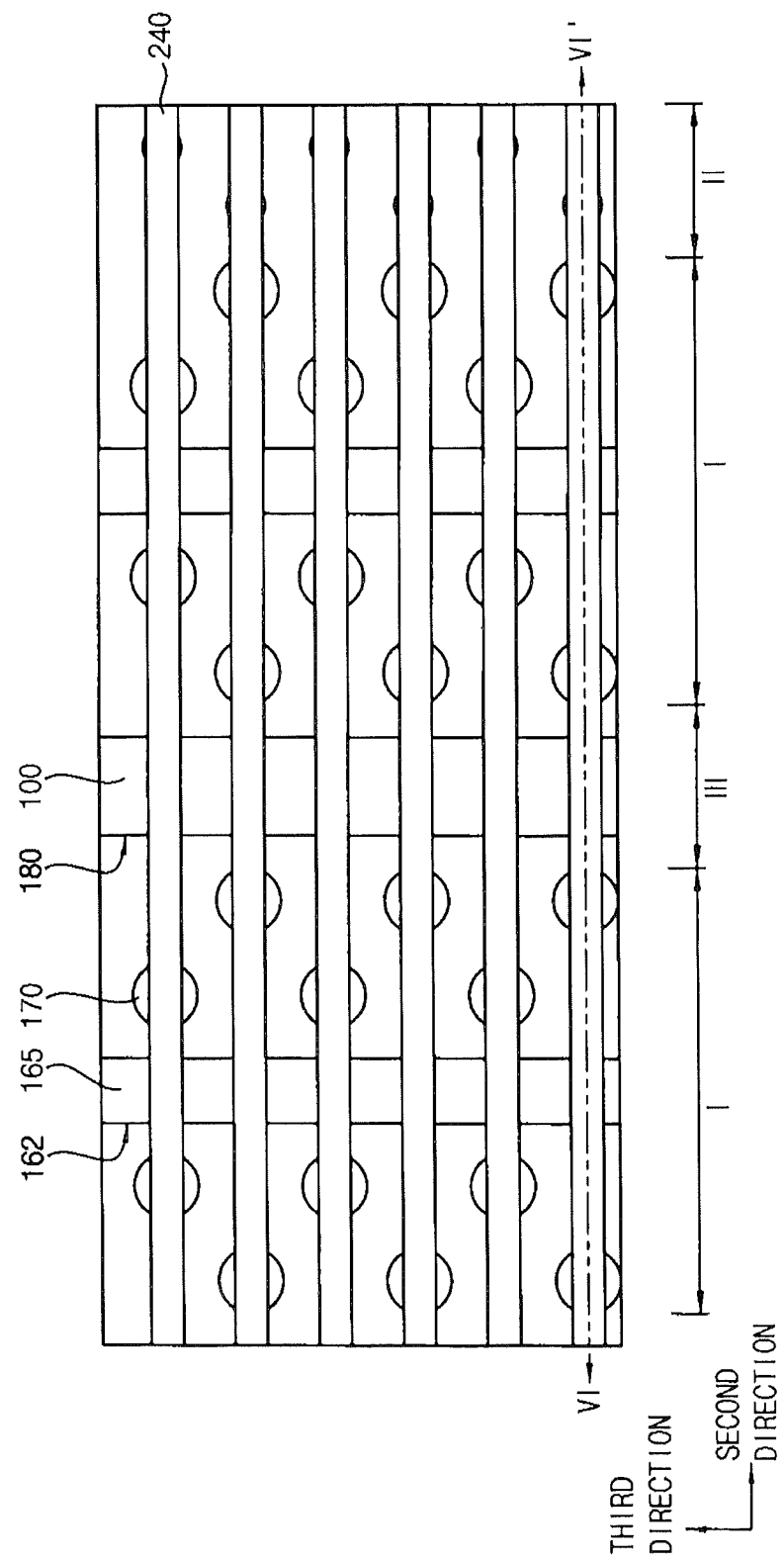

Referring to FIG. 12A, a second insulation pattern 220 may be formed to fill the first opening 180. A bit line contact 235 may be formed to be electrically connected to a bit line 240.

In some embodiments, after a third insulating interlayer filling the first opening 180 is formed on the substrate 100 and the uppermost the first insulation pattern 115, the third insulating interlayer may be planarized until a top surface of the uppermost first insulation layer pattern 115 may be exposed to form the second insulation layer pattern 220.

A third insulation layer 230 may be formed on the first and second insulation layer patterns 115 and 220, the pad 170 and the division layer pattern 165, and a second opening 232 may be formed to expose a top surface of the pad 170. In some embodiments, a plurality of second openings 232 corresponding to the plurality of pads 170 may be formed to define a second opening array.

The bit line contact 235 may be formed on the pad 170 to fill the second opening 232. The bit line 240 electrically connected to the bit line contact 235 may be formed to complete the vertical memory device.

In some embodiments, a plurality of bit line contacts 235 corresponding to the pads 170 may be formed to form a bit line contact array. A plurality of bit lines 240 may be arranged in the third direction, and each bit line 240 may be formed to extend in the second direction.

As mentioned above, when the holes 130 are formed, the dummy holes 140a, 140b, 135a and 135b may be formed simultaneously. Also, the dummy patterns 145a, 145b, 134a and 134b may also be formed to fill the dummy holes 140a, 140b, 135a and 135b, respectively. As the dummy holes 140a, 140b, 135a and 135b and the holes 130 may be formed evenly. Thus, a mis-alignment by a deformation of the first insulation layers 110 and the sacrificial layers 120 may be reduced and/or prevented.

FIG. 13 is a horizontal cross-sectional view illustrating methods of manufacturing vertical memory devices in accordance with some embodiments.

The methods of manufacturing the vertical memory devices may be substantially the same as or similar to that of FIGS. 4 to 12, except for dummy openings 136 and 141. Thus, like reference numerals refer to like elements, and repetitive explanations thereon may be omitted herein.

First, processes substantially the same as or similar to those illustrated with reference to FIG. 4A may be performed. A first insulation layer 110 and a sacrificial layer 120 may be alternately and repeatedly formed on a substrate 100.

Referring to FIG. 13, dummy openings 141 and 136 may be formed in the second and third regions II and III of the substrate 100, respectively. When the holes 130 are formed, the dummy openings 141 and 136 may be formed, simultaneously.

In some embodiments, when the dummy openings 141 and 136 are formed, the first dummy opening 141 may be formed to expose the second region II of the substrate 100 and the second dummy opening 136 may be formed to expose the third region III of the substrate 100. For example, the dummy openings 141 and 136 may be formed to extend in the first direction.

In some embodiments, the first and second dummy openings 141 and 136 may have a line shape which extends in the third direction. The first and second dummy openings 141 and 136 may have a smaller width that that of holes 130.

Processes substantially the same as or similar to those illustrated with reference to FIGS. 6 to 12 may be performed to manufacture the vertical memory devices.

As mentioned above, when the holes 130 are formed, the dummy openings 141 and 136 may be formed simultaneously. Also, the dummy patterns may also be formed to fill the dummy openings 141 and 136. The dummy patterns corresponding to the dummy openings 141 and 136 may have a line shape which extends in the third direction. The volumes of the first insulation layers 110 and the sacrificial layers 120 may be reduced to reduce or prevent mis-alignment by a deformation of the first insulation layers 110 and the sacrificial layers 120. Thus, the holes 130 may be formed evenly and a mis-alignment may be reduced or prevented.

FIG. 14 is a horizontal cross-sectional view illustrating method of manufacturing vertical memory devices in accordance with some embodiments.

The vertical memory device may be substantially the same as or similar to that of FIGS. 4 to 12, except for dummy openings 142a, 142b, 137a and 137b. Thus like reference numerals refer to like elements, and repetitive explanations thereon may be omitted herein.

First, processes substantially the same as or similar to those illustrated with reference to FIG. 4A may be performed. A first insulation layer 110 and a sacrificial layer 120 may be alternately and repeatedly formed on a substrate 100.

Referring to FIG. 14, dummy openings 142a, 142b, 137a and 137b may be formed in the second and third regions II and III of the substrate 100, respectively.

In some embodiments, when the dummy openings 142a, 142b, 137a and 137b are formed, first and second dummy openings 142a and 142b may be formed to expose the second region II of the substrate 100, and third and fourth dummy openings 137a and 137b may be formed to expose the third region III of the substrate 100. For example, the first to fourth dummy openings 142a, 142b, 137a and 137b may be formed to extend in the first direction.

In some embodiments, the first to fourth dummy openings 142a, 142b, 137a and 137b may have a line shape which extends in the third direction.

Processes substantially the same as or similar to those illustrated with reference to FIGS. 6 to 12 may be performed to manufacture the vertical memory device.

As mentioned above, when the holes 130 are formed, the dummy openings 142a, 142b, 137a and 137b may be formed simultaneously. Also, the dummy patterns may also be formed to fill the dummy openings 142a, 142b, 137a and 137b. The dummy patterns corresponding to the dummy openings 142a, 142b, 137a and 137b may have a line shape which extends in the third direction. The volumes of the first insulation layers 110 and the sacrificial layers 120 may be reduced to reduce or prevent a mis-alignment by a deformation of the first insulation layers 110 and the sacrificial layers 120. Thus, the holes 130 may be formed evenly and, a mis-alignment may be prevented or reduced.

FIG. 15 is a horizontal cross-sectional view illustrating methods of manufacturing vertical memory devices in accordance with some embodiments.

The vertical memory devices may be substantially the same as or similar to that of FIGS. 4 to 12, except for dummy holes 143a, 143b, 138a and 138b. Thus like reference numerals refer to like elements, and repetitive explanations thereon may be omitted herein.

First, processes substantially the same as or similar to those illustrated with reference to FIG. 4 may be performed. A first insulation layer 110 and a sacrificial layer 120 may be alternately and repeatedly formed on a substrate 100.

Referring to FIG. 15, dummy holes 143a, 143b, 138a and 138b may be formed in the second and third regions II and III of the substrate 100, respectively.

In some embodiments, when the dummy holes 143a, 143b, 138a and 138b are formed, first and second dummy holes 143a and 143b may be formed to expose the second region II of the substrate 100, and third and fourth dummy holes 138a and 138b may be formed to expose the third region III of the substrate 100. In some embodiments, a plurality of the dummy holes 143a, 143b, 138a and 138b may be formed in the second and the third directions. In some embodiments, the first to fourth dummy holes 143a, 143b, 138a and 138b may have a rectangular shape which extends in the third direction.

Processes substantially the same as or similar to those illustrated with reference to FIGS. 6 to 12 may be performed to manufacture the vertical memory devices. For example, the dummy patterns may be formed to fill the dummy holes 143a, 143b, 138a and 138b. The dummy patterns may have a rectangular shape which extends in the third direction.

In some embodiments, the dummy holes 143a, 143b, 138a and 138b may have a various shape to achieve the effects.

Figure 17:
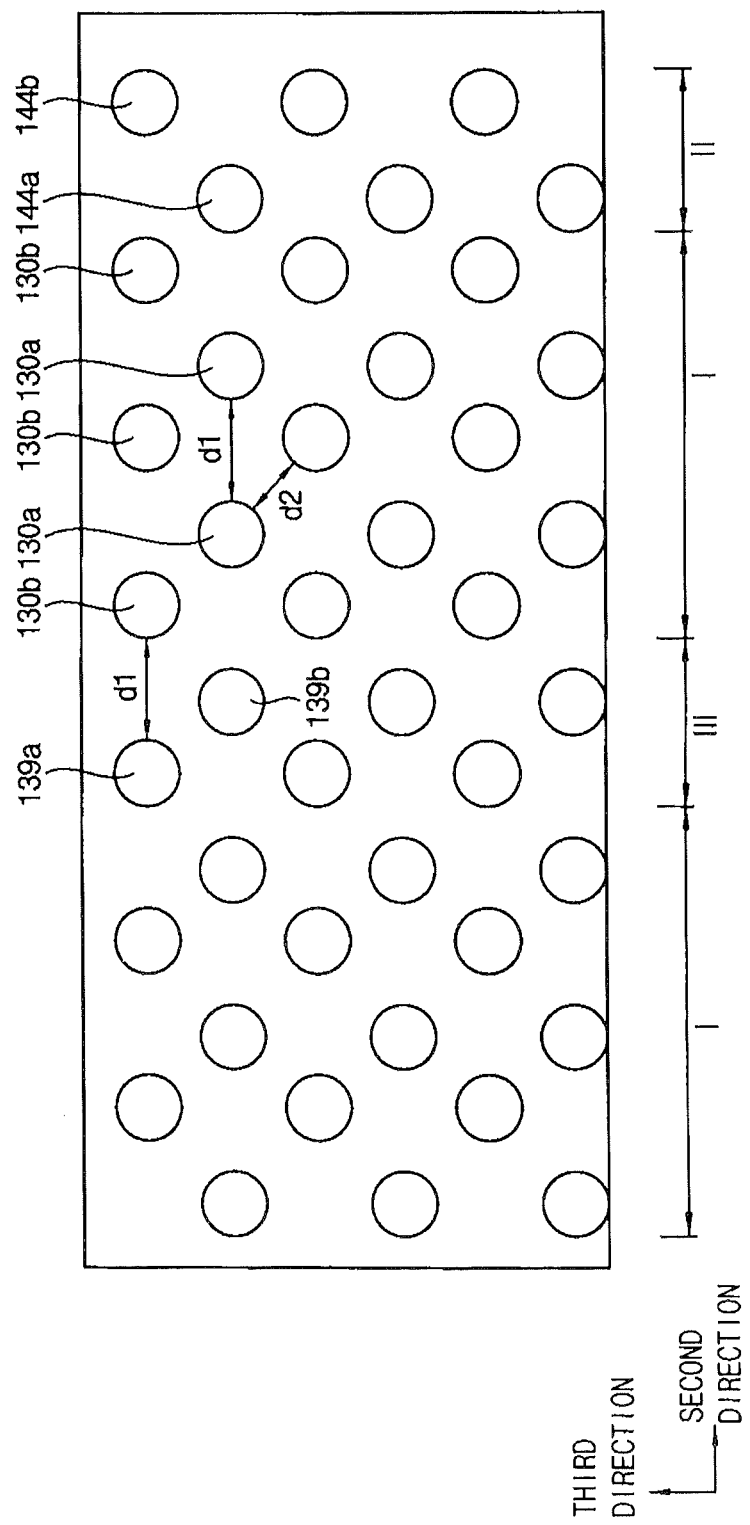

FIG. 16A and FIG. 17 are a horizontal cross-sectional view illustrating methods of manufacturing vertical memory devices in accordance with some embodiments. FIG. 16B is a vertical cross-sectional view cut along the line VII-VII'. FIG. 16C is a vertical cross-sectional view cut along the line VIII-VIII'.

First, processes substantially the same as or similar to those illustrated with reference to FIG. 4A may be performed. A first insulation layer 110 and a sacrificial layer 120 may be alternately and repeatedly formed on a substrate 100.

Referring to FIGS. 16A to 16C, when the first holes 130a are formed in the first region I of the substrate 100, first dummy holes 144a may be formed in the second region II of the substrate 100 and fourth dummy holes 139b may be formed in the third region III of the substrate 100, simultaneously. In some embodiments, a plurality of first holes 130a, a plurality of first dummy holes 144a and a plurality of fourth dummy holes 139b may be arranged in the third direction.

In some embodiments, the first holes 130a and the first and fourth dummy holes 144a and 139b may have substantially the same size. The first holes 130a may be spaced apart from the first and the fourth dummy holes 144a and 139b by a first distance d1. The first holes 130a and the first and fourth dummy holes 144a and 139b may be arranged at a distance, regularly and repeatedly, so that an etching process may be performed easily.

Referring to FIG. 17, when the second holes 130b are formed in the first region I of the substrate 100, second and third dummy holes 144b and 139a may be formed, simultaneously. In some embodiments, a plurality of second holes 130b, a plurality of second dummy holes 144b and a plurality of third dummy holes 139a may be formed in the third direction. The second holes 130b may be spaced apart from the second and third dummy holes 144b and 139a by the first distance d1. The second holes 130b and the second and third dummy holes 144b and 139a may be arranged at a distance, regularly and repeatedly, so that an etching process may be performed easily. On the other hand, the second holes 130b may be spaced apart from the first and the fourth dummy holes 144a and 139b by a second distance d2 which is smaller than the first distance d1. Thus, more first and second holes 130a and 130b may be arranged in a given area.

Processes substantially the same as or similar to those illustrated with reference to FIGS. 6 to 12 may be performed to manufacture the vertical memory devices.

While some example embodiments have been particularly shown and described, it will be understood by one of ordinary skill in the art that variations in form and detail may be made therein without departing from the spirit and scope of the claims.

What is claimed is:

1. A vertical memory device, comprising:
a first stack of a plurality of gate electrodes on a substrate, the first stack of the plurality of gate electrodes extending in a first direction that is substantially perpendicular to a top surface of the substrate and ones of the plurality of gate electrodes being stacked along the first direction;
a plurality of channels extending through the first stack of the plurality of gate electrodes along the first direction;
a plurality of charge storage layer structures, each of the plurality of charge storage layer structures being on respective sidewalls of the plurality of channels and including a tunnel insulation layer pattern, a charge storage layer pattern and a blocking layer pattern;
a plurality of dummy patterns extending through the first stack of the plurality of gate electrodes in the first direction, ones of the plurality of dummy patterns being enclosed by the first stack of the plurality of the gate electrodes;
a second stack of a plurality of gate electrodes on the substrate, the second stack of the plurality of gate electrodes being spaced apart from the first stack of the plurality of gate electrodes in a second direction that is substantially perpendicular to the first direction; and
a source line in a portion of the substrate that is between the first stack of the plurality of gate electrodes and the second stack of the plurality of gate electrodes.

2. The vertical memory device of claim 1, wherein ones of the plurality of dummy patterns include silicon oxide, silicon nitride or polysilicon.

3. The vertical memory device of claim 1, wherein top surfaces of ones of the plurality of dummy patterns have a circular shape, an elliptical shape and/or a polygonal shape.

4. The vertical memory device of claim 1, wherein top surfaces of ones of the plurality dummy patterns have a linear shape which extends in a third direction that is substantially perpendicular to the first direction.

5. The vertical memory device of claim 1, wherein ones of the plurality of dummy patterns have a smaller width than a width of ones of the plurality of channels.

6. The vertical memory device of claim 1, wherein the plurality of dummy patterns comprises:
a first dummy pattern column including first ones of the plurality of dummy patterns disposed along a third direction that is substantially perpendicular to the first direction and the second direction; and
a second dummy pattern column including second ones of the plurality of dummy patterns disposed along the third direction, the first dummy pattern column and the second dummy pattern column being spaced apart from each other in the second direction.

7. The vertical memory device of claim 1, wherein ones of the plurality of dummy patterns have a top surface that is substantially coplanar with a top surface of ones of the plurality of channels.

8. The vertical memory device of claim 1, wherein each of the plurality of dummy patterns has a unitary structure.

9. The vertical memory device of claim 8, wherein the plurality of dummy patterns contacts the first stack of the plurality of gate electrodes.

10. The vertical memory device of claim 1, further comprising a bit line on the first stack of the plurality of gate electrodes and extending in the second direction, wherein ones of the plurality of the channels and one of the plurality of the dummy patterns are spaced apart along the second direction.

11. A vertical memory device, comprising:
   a plurality of channels disposed in a first region of a substrate and extending in a first direction that is substantially perpendicular to a top surface of the substrate;
   a plurality of charge storage layer structures, each of the plurality of charge storage layer structures being on respective sidewalls of the plurality of channels;
   a stack of a plurality of gate electrodes extending in the first direction, the plurality of gate electrodes being arranged on the sidewalls of the plurality of charge storage layer structures and spaced apart from each other in the first direction;
   a plurality of dummy patterns disposed in a second region of the substrate that is adjacent the first region of the substrate, each of the plurality of dummy patterns extending in the first direction and having a smaller width than a width of ones of the plurality of channels, and the plurality of dummy patterns being disposed in and extending through the stack of the plurality of gate electrodes; and
   a source line in a portion of the substrate that is adjacent a side of the stack of the plurality of gate electrodes, the source line being spaced apart from the plurality of dummy patterns, wherein the first region of the substrate is between the source line and the second region of the substrate.

12. The vertical memory device of claim 11, wherein ones of the plurality dummy patterns have a linear shape which extends in a second direction that is substantially perpendicular to the first direction.

13. The vertical memory device of claim 11, wherein the plurality of dummy patterns comprises:
   a first dummy pattern column including a plurality of first dummy patterns formed in a second direction that is substantially perpendicular to the first direction; and
   a second dummy pattern column including a plurality of second dummy patterns formed in the second direction and spaced apart from the first dummy pattern column.

14. The vertical memory device of claim 11, wherein ones of the plurality of dummy patterns have a top surface that is substantially coplanar with a top surface of ones of the plurality of channels.

15. The vertical memory device of claim 11, wherein each of the plurality of dummy patterns has a unitary structure.

16. The vertical memory device of claim 11, further comprising a bit line on the plurality of gate electrodes and extending in a second direction that is substantially perpendicular to the first direction, wherein ones of the plurality of the channels and one of the plurality of the dummy patterns are spaced apart along the second direction.

17. A vertical memory device, comprising:
   a stack of a plurality of gate electrodes on a substrate, the stack of the plurality of gate electrodes extending in a first direction that is substantially perpendicular to a top surface of the substrate and ones of the plurality of gate electrodes being stacked along the first direction;
   a plurality of channels extending through the stack of the plurality of gate electrodes along the first direction;
   a plurality of charge storage layer structures, each of the plurality of charge storage layer structures being on respective sidewalls of the plurality of channels and comprising a charge storage layer pattern;
   a plurality of dummy patterns extending through the stack of the plurality of gate electrodes in the first direction, each of the plurality of dummy patterns comprising a unitary structure; and
   a bit line on the stack of a plurality of gate electrodes, the stack of the plurality of gate electrodes being between the substrate and the bit line, and the plurality of dummy patterns extending through an uppermost one of the plurality of gate electrodes that is closest to the bit line.

18. The vertical memory device of claim 17, further comprising:
   an insulation layer between the uppermost one of the plurality of gate electrodes and the bit line; and
   a bit line contact extending through the insulation layer and connecting the bit line to one of the plurality of channels, wherein a lower surface of the insulation layer is coplanar with upper surfaces of the plurality of dummy patterns.

19. The vertical memory device of claim 17, wherein the bit line extends in a second direction that is substantially perpendicular to the first direction, and
   wherein the plurality of the channels and the plurality of the dummy patterns are spaced apart along the second direction.

20. The vertical memory device of claim 17, further comprising a source line in a portion of the substrate that is adjacent a side of the stack of the plurality of gate electrodes, wherein the plurality of charge storage layer structures are between the source line and the plurality of dummy patterns.

* * * * *